United States Patent
Berglund

(10) Patent No.: US 6,803,582 B2
(45) Date of Patent: Oct. 12, 2004

(54) ONE DIMENSIONAL BEAM BLANKER ARRAY

(75) Inventor: C. Neil Berglund, Camas, WA (US)

(73) Assignee: Oregon Health & Science University, Portland, OR (US)

(*) Notice: Subject to any disclaimer, the term of this patent is extended or adjusted under 35 U.S.C. 154(b) by 0 days.

(21) Appl. No.: 10/428,869

(22) Filed: May 2, 2003

(65) Prior Publication Data

US 2004/0104353 A1 Jun. 3, 2004

Related U.S. Application Data

(60) Provisional application No. 60/429,956, filed on Nov. 29, 2002.

(51) Int. Cl.$^7$ .......................... H01J 37/08; H01J 3/14; H01J 3/26; G01N 23/00
(52) U.S. Cl. .................. 250/396 R; 250/334; 250/398; 250/492.1; 250/492.22; 250/492.23; 250/492.3; 250/309; 250/310; 250/311; 250/442.11
(58) Field of Search ............................ 250/396 R, 398, 250/491.1, 492.2

(56) References Cited

U.S. PATENT DOCUMENTS

| 4,390,789 | A | * | 6/1983 | Smith et al. .............. 250/492.2 |
| 5,144,142 | A | * | 9/1992 | Fueki et al. ............. 250/396 R |
| 5,892,224 | A | | 4/1999 | Nakasuji |
| 6,145,438 | A | * | 11/2000 | Berglund et al. ......... 101/463.1 |
| 6,483,120 | B1 | * | 11/2002 | Yui et al. .................. 250/491.1 |
| 6,515,409 | B2 | * | 2/2003 | Muraki et al. ............ 313/359.1 |
| 6,538,597 | B1 | * | 3/2003 | Steudel ......................... 342/17 |
| 6,566,664 | B2 | * | 5/2003 | Muraki ..................... 250/492.2 |
| 2002/0117967 | A1 | * | 8/2002 | Gerlach et al. ............. 315/13.1 |
| 2003/0209674 | A1 | * | 11/2003 | Hamaguchi et al. . 250/396 ML |

* cited by examiner

Primary Examiner—John R. Lee
Assistant Examiner—Bernard Souw
(74) Attorney, Agent, or Firm—Schwabe, Williamson & Wyatt, P.C.

(57) ABSTRACT

A beam array includes a base plate, a plurality of conductor pads, and a ground plate. The conductor pads are arranged in a one-dimensional array on the base plate. The ground plate is coupled to the base plate over the plurality of conductor pads with a gap between the base plate and the ground plate. Each of the plurality of conductor pads forms a beam blanker across the gap with the ground plate.

98 Claims, 17 Drawing Sheets

ONE DIMENSIONAL BEAM BLANKER ARRAY

RELATED APPLICATIONS

This application claims priority to U.S. Provisional Application No. 60/429,956, entitled "Electron Beam Line Segment Scanning," filed on Nov. 29, 2002, which is hereby fully incorporated by reference.

FIELD OF THE INVENTION

The present invention pertains to the field of beam blankers. More particularly, this invention relates to a one dimensional beam blanker array.

BACKGROUND

An electron beam can be controlled with exacting precision, which makes electron beams particularly useful for a number of applications. A scanning electron microscope (SEM) is a common example. As an electron beam is scanned across a surface, secondary electrons are emitted from the surface, detected, and used to create a topographical image of the surface. The precision of the electron beam allows a SEM to detect incredibly minute detail.

As another example, in addition to inspecting a surface, an electron beam can be used to imprint an image on a surface. This is often called electron beam lithography, and it can be done in many different ways. In a typical process, a surface is coated with a film that is sensitive to electrons. An electron beam exposes only certain areas of the film and a chemical process dissolves away either the exposed or unexposed film, leaving behind an image imprinted on the surface.

Lithography has a number of useful applications, not the least of which is integrated circuit (IC) manufacturing. Circuit designs can be built on a chip by imprinting one or more layers of circuit components on the chip's surface. Electron beam lithography performed directly on a wafer, however, has not been commercially successful because the primary competing technology, optical lithography using photomasks, has been much faster.

Optical lithography uses a light source and a mask to imprint an image onto a surface. Typically, the surface is covered with a photosensitive film, and the light source partially exposes the film by projecting an image through the mask onto the surface. Chemical processing removes either the exposed or unexposed film to leave the image imprinted on the surface. Optical lithography has been much faster than electron beam lithography largely because, in optical lithography, an entire image can be imprinted in a single exposure where as, in electron beam lithography, the image is sequentially "drawn" using the electron beam.

Although optical lithography has been much faster than electron beam lithography, optical lithography is rapidly approaching its theoretical limits. That is, progress is continually pushing for smaller and denser designs. For integrated circuits in particular, smaller and denser designs translate into smaller chips and/or more functionality per chip. As minimum feature sizes in these designs drop into the submicron range, features are often smaller than the wavelength of the light sources used in optical lithography. At sub-wavelength levels, the behavior of light changes and becomes more complicated. A variety of technologies have been developed to compensate for the sub-wavelength behavior of light in optical lithography, including mask manipulations and multiple exposure techniques. Each technology, however, adds cost and time to the manufacturing process. At some point, progress will necessitate feature sizes that optical lithography simply cannot create, or cannot create economically.

In order to progress further, electron beam lithography is likely to be the way of the future. With the precision control of an electron beam, electron beam lithography can create incredibly small feature sizes, well into the nanometer range, without using a mask. Speed, however, remains a primary stumbling block for commercially viable electron beam lithography.

There are two major obstacles to speed in electron beam lithography. The first is Coulomb interaction, where like-charged particles repel one another. For instance, assuming that a certain dose of electrons are needed to expose a film, and assuming a beam has a particular dose rate for delivering electrons, the speed at which the beam moves across the film is limited. If the beam goes too fast, the film will not be adequately exposed. One way to increase the speed is to increase the dose rate of the beam. With more electrons being deposited per unit time, the beam can move faster and still adequately expose the film.

There is a trade-off, however, due to Coulomb interaction. The negatively charged electrons in an electron beam repel one another, causing the beam to spread out as the beam travels to the film. Increasing the number of electrons causes more spreading in the beam, making the beam size fatter and less precise on the film. In other words, due to Coulomb interaction, speed is limited by a combination of the film's exposure sensitivity, the desired size of the beam, and the dose rate of the beam.

The second major obstacle in electron beam lithography is the pattern delivery rate. Various approaches have been developed to deliver patterns with an electron beam. One main approach is raster scan, in which an entire surface is scanned, usually going horizontally across the surface and moving vertically down the surface one horizontal line at a time until every "pixel" of the surface is scanned. For a single-beam system, the beam is turned on wherever the pattern indicates that the film is to be exposed.

Another main approach is vector scan, in which a surface is broken up into vector locations. Each vector location corresponds to a small block of surface area. To project an image in a single-beam system, the beam is directed to a vector location on the surface that includes part of the pattern and the beam flashes small primitive shapes of electrons to build up the desired pattern.

Vector scan can be much faster than raster scan for images that do not cover large portions of a surface area because vector scan does not need to scan over every pixel of the surface. However, most patterns, particularly in IC designs, use nearly half of available surface area. In which case, vector scan can actually be slower than raster scan.

In both of these approaches, the pattern delivery rate is limited by the physical constraints of the system. Often times, electric fields are used to scan an electron beam over a scan field and mechanical stage motion is used to move from one scan field to another. For instance, in raster scan, a wafer can be attached to a stage that can move relative to an electron beam column. The stage can align the beam with a particular scan field on the wafer and electric fields can sweep the beam across the scan field. Similarly, in vector scan, the vector location can be addressed by moving the stage and electric fields can be used to imprint the shapes.

Using a single beam, both raster scan and vector scan can take many hours to write a typical IC pattern to a wafer, compared to several minutes for optical lithography. In order to increase speed, a number of research programs have attempted to create multiple-beam systems. One of these systems uses multiple single-beam mini-columns in close proximity. While some progress has been made in miniaturizing single-beam columns, this approach has been largely unsuccessful at least partially due to the vast number of columns needed. To be competitive with optical lithography, an electron beam system is likely to need many thousands of columns. That level of integration has proven very difficult to attain.

Another one of these systems generates multiple beams from a single beam column using a micro-blanker array. A blanker is a common element in most electron beam columns. An electron source produces a stream of electrons. A series of electrical elements generate electric and/or magnetic fields that direct the stream of electrons into a beam. The beam passes through a blanker that is aligned with an aperture. The blanker usually comprises two electrodes. When a voltage is applied across the electrodes, the resulting electric field diverts the beam away from the aperture, preventing the beam from passing through the remainder of the column. By modulating the blanker voltage, the beam can effectively be turned on and off at a much faster rate than the electron source can be turned on and off.

Rather than a single blanker, a micro-blanker array usually includes multiple holes in an IC chip, with electrodes and control circuitry integrated into the chip around each hole. Segments of the beam passing through holes in the array can be individually diverted away from the aperture by separately applying a voltage to the electrodes surrounding respective holes, thus creating multiple beam segments from a single beam source. With the micro-blanker array, the beam can cover a block of surface area at a time rather than one dot at a time.

As with column miniaturization however, the micro-blanker array has been largely unsuccessful due to numerous limitations and problems in the technology. For instance, the supporting circuitry around each hole requires a certain amount of space and separation from neighboring holes, and more space is needed for larger numbers of holes. The spacing requirement limits how close the holes can be and therefore limits the fraction of the beam current that can be projected through the blanker array.

Furthermore, in order to divert electrons, each hole requires a certain combination of electrode length and voltage level. The shorter the length of the electrodes, the higher the voltage level that is needed. The length of the electrodes is limited by the thickness of the IC chip, necessitating a certain minimum voltage level. The higher the voltage level, the more isolation and separation that is needed between holes in the array and the less likely it is to find a semiconductor process capable of providing the necessary voltages.

As a result of these and countless other problems, most multiple-beam lithography programs have been unsuccessful.

BRIEF DESCRIPTION OF THE DRAWINGS

Examples of the present invention are illustrated in the accompanying drawings. The accompanying drawings, however, do not limit the scope of the present invention. Similar references in the drawings indicate similar elements.

DETAILED DESCRIPTION

Figure 1:
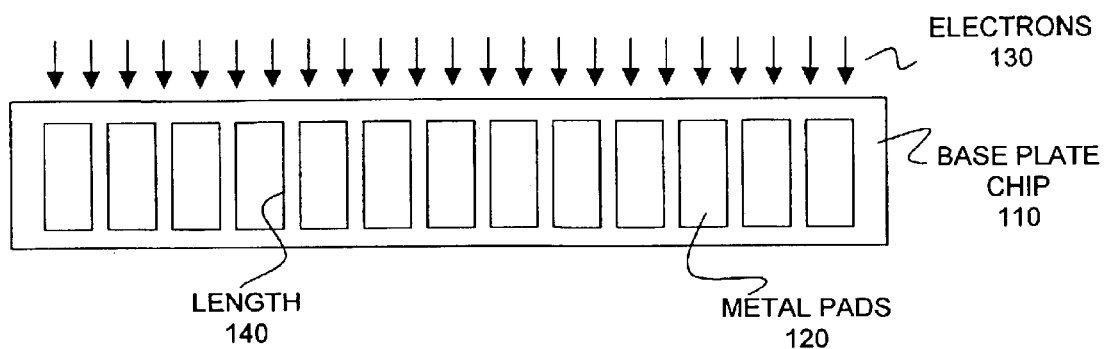
FIG. 1 illustrates one embodiment of a base plate having an array of conductor pads.

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful for understanding the present invention. However, the order of description should not be construed as to imply that these operations are necessarily performed in the order they are presented, nor even order dependent. Lastly, repeated usage of the phrase in one embodiment does not necessarily refer to the same embodiment, although it may.

Embodiments of the present invention provide a new kind of micro-blanker array. Rather than projecting one beam at a time, or projecting a two-dimensional block of beam segments at a time, embodiments of the present invention can project a one-dimensional line of beam segments. And, rather than using holes in a IC chip to blank beam segments, embodiments of the present invention turn the blanker array on its edge relative to the beam direction. For instance, in one embodiment, the inventive blanker array comprises two IC chips separated by a gap through which the beam passes. One of the two chips comprises a ground electrode and the other chip comprises an array of conductor pads. Each conductor pad forms a separate micro-blanker with the ground electrode. Voltage can be selectively applied to individual conductor pads to individually divert, or blank, linear segments of the beam.

As shown and discussed in the examples and embodiments below, turning the blanker array on its edge relative to the beam greatly simplifies the design, improving manufacturability, pattern fidelity, and pattern delivery rate. For instance, embodiments of the present invention can improve the pattern deliver rate by using large numbers of beam segments simultaneously. And, by substantially improving the pattern delivery rate, embodiments of the present invention can reduce the Coulomb interaction problem. That is, by using a large number of beam segments simultaneously to cover a comparatively large area, relatively weak, slow, and precise individual beam segments can be used while still providing an excellent overall pattern delivery rate. Embodiments of the present invention can write a typical IC pattern to a wafer in mere minutes using multiple columns in order to further reduce the Coulomb interaction limitations.

Moreover, unlike optical lithography, which is approaching theoretical technological limits, embodiments of the present invention can be manufactured using the same IC technology that can be created using electron beam lithography. In other words, as IC technology progresses toward smaller feature sizes and denser patterns, the same IC technology can be used to make the inventive micro-blanker arrays with larger numbers of beam segments for faster pattern delivery and finer beam segments for smaller feature sizes and denser patterns. Therefore, embodiments of the present invention can progress right along with progress in IC technology.

Manufacturability can be greatly improved because embodiments of the present invention utilize surfaces to form blanker elements rather than holes. For instance, an IC chip surface can provide a great deal more area for long and narrow blanker electrodes. And, since IC chips can include multiple levels of circuitry, all of the control circuitry, isolation features, and many other useful functions can easily be integrated directly into the chips under and around the blanker electrodes.

Although the present invention is primarily described in the context of electron beam lithography, embodiments of the present invention can be used in a variety of other applications, such as inspection, as well as with other beams, such as ions.

Example Embodiments of the Blanker Array Apparatus

Figure 2:
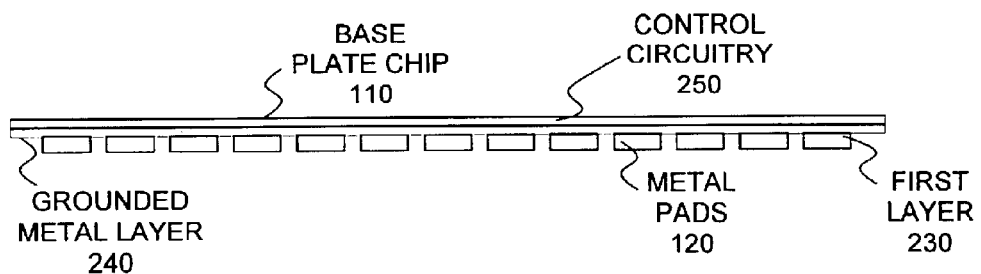
FIG. 2 illustrates the base plate of FIG. 1 from an edge view.
Figure 3:
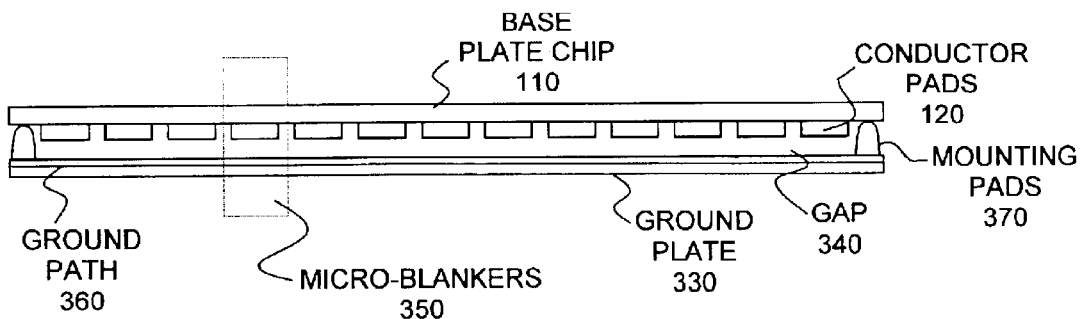
FIG. 3 illustrates the base plate of FIG. 1 coupled with a ground plate to form one embodiment of a micro-blanker array.

FIGS. 1–3 illustrate one embodiment of the inventive micro-blanker array comprising a base plate, a ground plate, and an array of conductor pads. In FIG. 1, the base plate comprises an integrated circuit (IC) chip 110 and the conductor pads comprise metal pads 120. The metal conductor pads 120 are integrated onto the surface of chip 110 in a one-dimensional array.

For purposes of illustration, the array includes just 13 conductor pads. In reality however, vast numbers of conductor pads can be integrated onto the surface of a chip.

For instance, in one embodiment, the array can include 50 thousand conductor pads. Other embodiments may use more or less conductor pads depending on the size of the chip and the technology used to manufacture the chip. Furthermore, although the conductor pads are said to be "on" the chip, they need not actually be on the external surface of the chip. That is, the conductor pads may be embedded within one or more layers of the chip or covered with any of a variety of materials for physical protection, electrical isolation, or the like.

FIG. 2 shows chip 110 from an edge to illustrate how the layers of the chip might be used. In the illustrated example, metal pads 120 are integrated into a first layer 230 of chip 110, a grounded metal layer 240 is integrated into chip 110 under the pads 120, and control circuitry 250 is integrated in chip 110 in layers under the grounded layer 240. Other embodiments may combine one or more of these features into one layer, or include additional layers and additional features.

FIG. 3 illustrates base plate 110 coupled with ground plate 330. In the illustrated embodiment, mounting pads 370 have been integrated into ground plate 330 to provide a gap 340 between the plates. Gap 340 may comprise an air gap between the plates or a-vacuum. Alternatively, gap 340 may be filled with any of a variety of materials or substances through which the beam may pass.

In other embodiments, mounting pads 370 could be integrated into base plate 110 or into both plates to provide gap 340. Alternatively, any number of approaches can be used to create a gap between the plates over the length of the conductor array.

In the illustrated embodiment, in addition to mounting pads 370, a ground path 360 has also be integrated into ground plate 330. Ground path 360 grounds at least a region of the ground plate 330 that is aligned with the array of conductor pads 120. Base plate 110 and ground plate 330 together comprise an array of micro-blankers 350 across gap 340.

When electrons 130 are incident upon the blanker array, a line of the electrons passes through gap 340. Control circuitry 250 can selectively apply a voltage to individual conductor pads 120 to create electric and/or magnetic fields across the gap to deflect segments of the line of electrons. Grounded layer 240 provides some degree of electrical isolation between each conductor pad 120 to limit the amount of voltage leaking from one pad to the next.

In the illustrated embodiment, mounting pads 370 separate the plates so that the plates are substantially parallel to one another. There is no requirement, however, that the base plate and ground plate be substantially parallel. For example, the plates may be aligned approximately parallel to one another along the length of the blanker array, but substantially non-parallel in the electron beam direction. That is, the gap may be tapered so that the gap is wider where the electrons enter the blanker and narrower where the electrons exit-the blanker, or vice versa.

Figure 4:
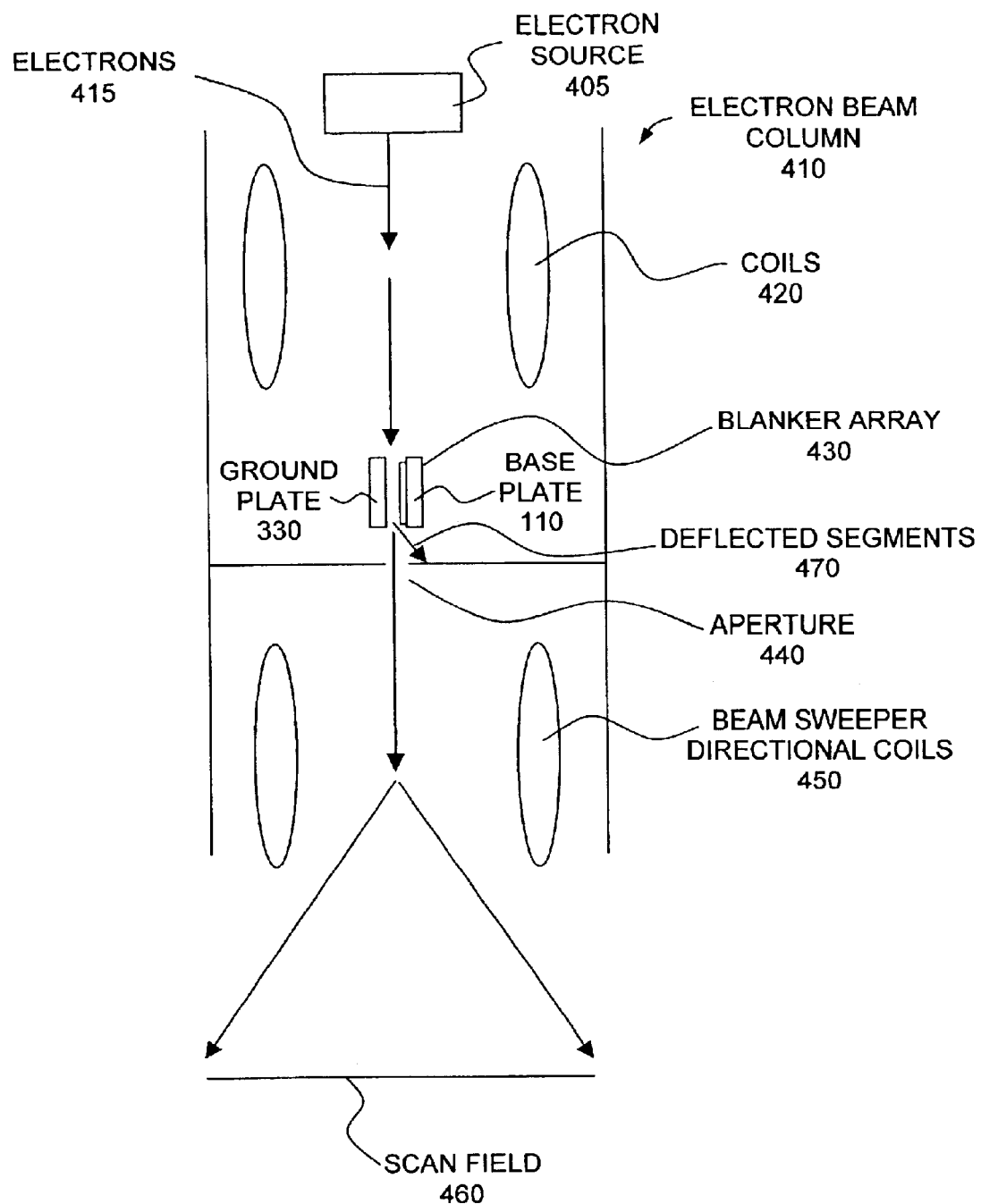
FIG. 4 illustrates one embodiment of an electron beam column using an embodiment of the inventive micro-blanker array.

FIG. 4 illustrates one embodiment of an electron beam column 410 in which embodiments of the present invention can be used. Except for the inventive micro-blanker array, electron beam column 410 is intended to represent a broad range of columns, such as those used in scanning electron microscopes (SEMs).

Beam column 410 includes an electron source 405, a first set of coils or electrodes 420, an aperture 440, and directional coils or electrodes 450. Electron source 405 generates a stream of electrons 415. Coils 420 generate electrical fields to direct the electrons toward aperture 440. The column would normally include a blanker aligned with aperture 440 to selectively deflect the electron beam. In the illustrated embodiment however, the normal blanker has been replaced with an embodiment of the inventive micro-blanker array 430, such as the blanker array of FIGS. 1–3.

In the illustrated embodiment, blanker array 430 is viewed from the ends of the ground plate 330 and the base plate 110. Electrons 415 that do not pass through the gap in blanker 430 are stopped either by the body of blanker 430 or the surface surrounding aperture 440. That is, only the line of electrons that pass undeflected through the gap in blanker 430 are aligned with aperture 440. This line of electrons is perpendicular to the page in the illustrated example. Blanker 430 can deflect individual segments 470 of the line of electrons away from aperture 440.

Directional coils 450 comprise a beam scanner. That is, coils 450 generate electric or magnetic fields that sweep the beam segments that pass through aperture 440 across a scan field 460. In the illustrated embodiment, the beam is swept in just one dimension. Other embodiments may include additional directional coils so that the beam can be swept in two dimensions. Other embodiments may also include additional coils to de-magnify, or concentrate, the beam, or to correct for aberrations. Column designs can de-magnify beam size by 10x to over 1000x, easily providing beam sizes of 10 nanometers and smaller.

Figure 5:
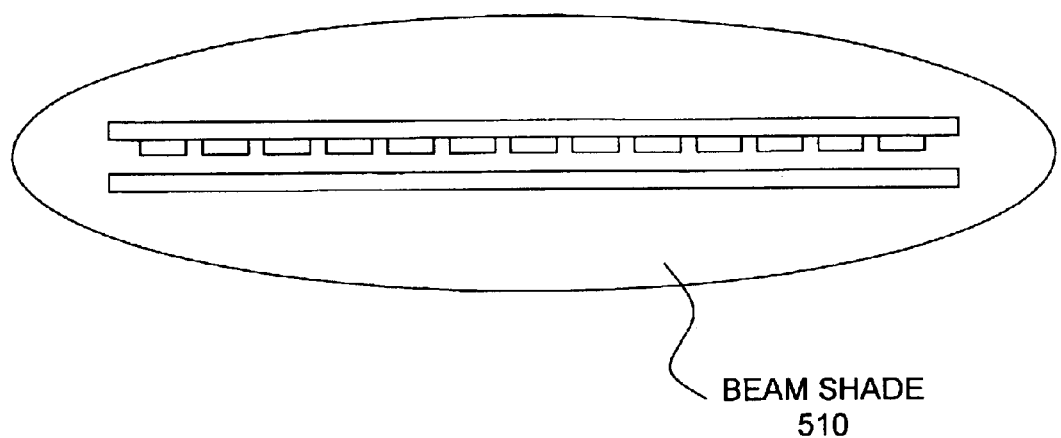
FIG. 5 illustrates one embodiment of a beam shape to concentrate electrons in a micro-blanker gap.

Although embodiments of the present invention can be used in existing electron beam columns with little or no modification, a variety of modifications can be made to improve performance. For instance, an electron beam usually has a circular cross-section. In which case, a large portion of the electrons in the beam miss the gap in the inventive micro-blanker array and are wasted. However, with some fairly minor modifications in electron source design and/or in the electrode configuration within the column, the beam shape can be changed to concentrate a larger portion of the electrons into the gap. For instance, FIG. 5 illustrates an oblong beam shape 510. The long dimension of the beam is substantially parallel to the length of the blanker array. In which case, for a given beam dose rate, more electrons pass through the gap when using the oblong beam shape 510 than when using a circular beam shape.

Figure 6:
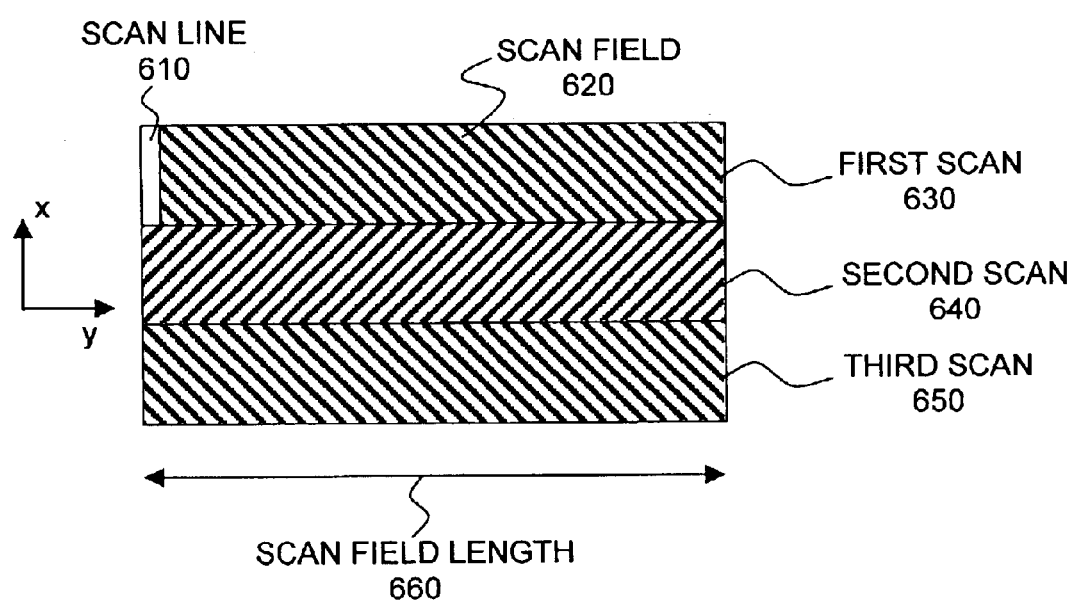
FIG. 6 illustrates one embodiment of a raster scan pattern generated using an embodiment of the inventive micro-blanker array.

FIG. 6 illustrates one embodiment of a scan pattern that could be created using embodiments of the present invention. The line of electrons formed by the micro-blanker array form a scan line 610. The entire scan line 610 can be scanned over a surface in a raster scan fashion. That is, rather than scanning a single line across the surface tens of thousands of times, embodiments of the present invention can scan tens of thousands of lines across the surface simultaneously, with each line individually modulated on and off as desired.

In the illustrated embodiment, the line of electrons are swept across a scan field 620 in a first scan 630 in a y direction. Once scan 620 is complete, scan line 610 is moved in the x direction for the second scan 640, followed by the third scan field 650. Depending on the length 660 of the scan field 620, the entire sweep in the y direction may be covered using directional coils. Similarly, scan line movement in the x direction may be accomplished using directional coils, at least for a certain number of incremental moves. Other embodiments may use mechanical motion rather than electrical fields. For instance, the surface being scanned and/or the electron beam column may be mounted on a stage so that the surface and column can be moved relative to one another. In still other embodiments, a combination of mechanical motion and electrical/magnetic fields could be used.

Figure 7:
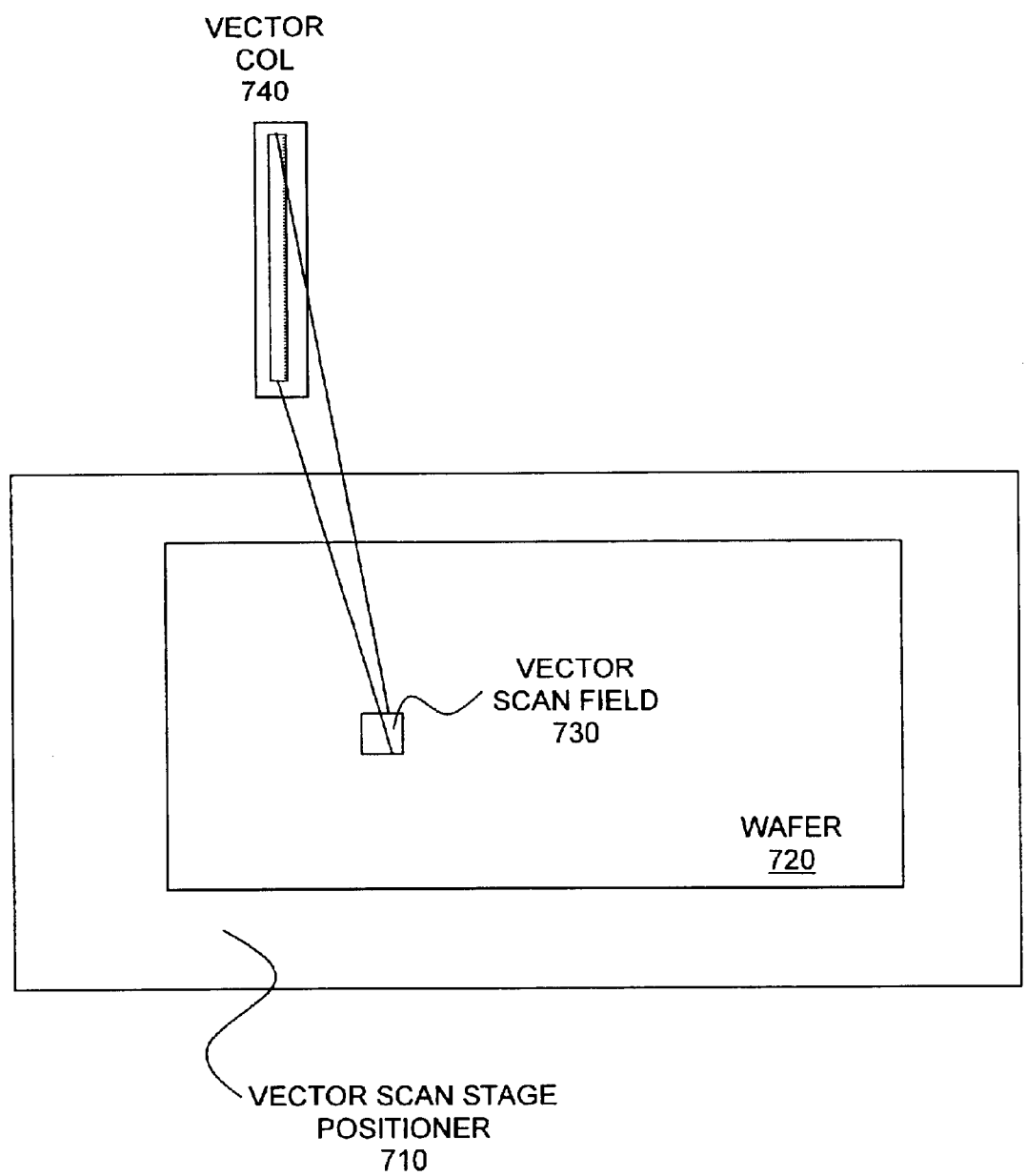
FIG. 7 illustrates one embodiment of a vector scan pattern generated using an embodiment of the inventive micro-blanker array.

FIG. 7 illustrates another example of how a surface can be scanned in a vector can fashion using embodiments of the present invention. In the illustrated example, a wafer 720 is mounted to a stage positioning device 710. A column 740 provides a beam line to a vector scan field 730 on wafer 720. With all of the line segments deflected, stage 710 can position wafer 720 relative to column 740 at a particular vector location. Then, the beam line can scan a block of area comprising scan field 730 at the vector location, with individual line segments turning on and off as desired.

In the illustrated embodiment, the scan field is the same width as the beam line length. In which case, the scan field is covered by one sweep of the beam line, after which the stage can be moved to the next vector location. In other embodiments, the scan field may be larger and the beam may perform a raster scan at the vector location to cover the entire area.

Figure 8:
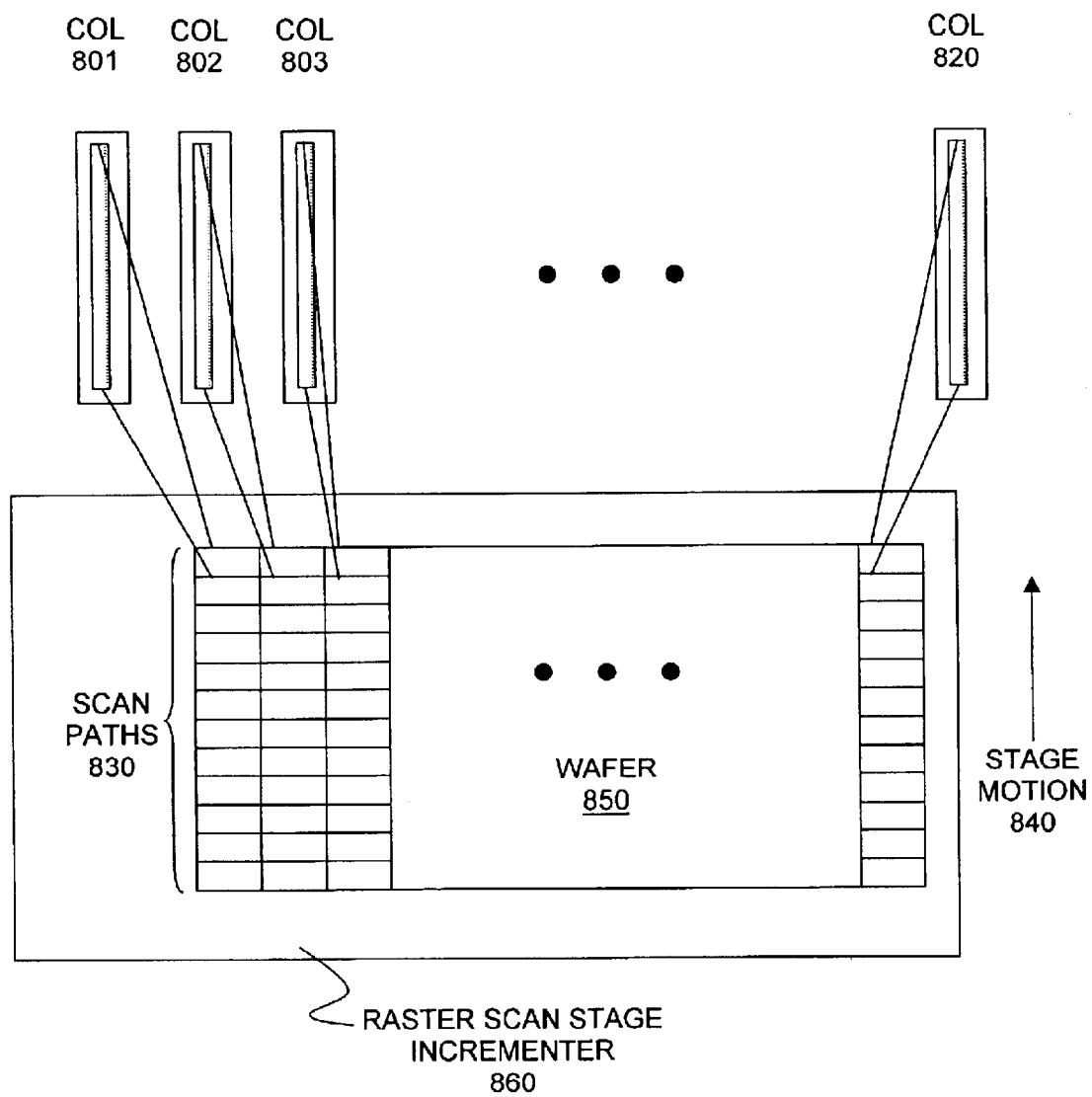
FIG. 8 illustrates one embodiment of a multi-column line-segment scanning system.

FIG. 8 illustrates one embodiment of how multiple inventive micro-blankers can be used together. In the illustrated embodiment, 20 beam columns 801–820 generate 20 parallel beam lines that are grouped in a row along a line perpendicular to the beam lines. Other embodiments may use a different number of columns depending on various factors, such as the size and cost of individual columns. Obviously, more columns can cover larger areas simultaneously.

Other embodiments may also arrange the beam lines in different orientations. For instance, parallel beam lines could be grouped in a column along a line parallel to the beam lines. Similarly, beam lines could be arranged in rows and columns.

In the illustrated embodiment, stage motion 840 is mechanical. That is, wafer 850 is mounted on a stage incrementer 860, and stage incrementer 860 aligns the beam columns 801–820 with a set of 20 scan paths 830. The 20 beam lines scan the 20 different beam paths 830 simultaneously. Then, stage incrementer 860 advances to the next set of 20 scan paths.

Using a single micro-blanker array having 50 thousand beam segments, a layer of a typical IC design can be written to wafer in a time limited only by Coulomb interactions. This is a substantial improvement compared to single-beam systems that may take 20 to 50 times as long to write state-of-the-art patterns. Furthermore, a system with 20 beam columns, such as the one described in FIG. 8, and having 50 thousand segments per beam line, can write a typical IC design at a rate of about 20 wafers per hour. A rate of 10 wafers per hour is usually considered commercially viable. As IC technology progresses, embodiments of the present invention will progress as well, providing even faster rates.

In addition to increasing the rate at which a design can be written, embodiments of the present invention can increase the rate at which a surface is inspected. As an electron beam is scanned across a surface, secondary electrons are emitted from the surface, detected, and used to create a topographical image of the surface. When using multiple beam segments simultaneously, it is necessary to distinguish electrons from individual beam segments in order to correlate surface features to particular locations.

Figure 9:
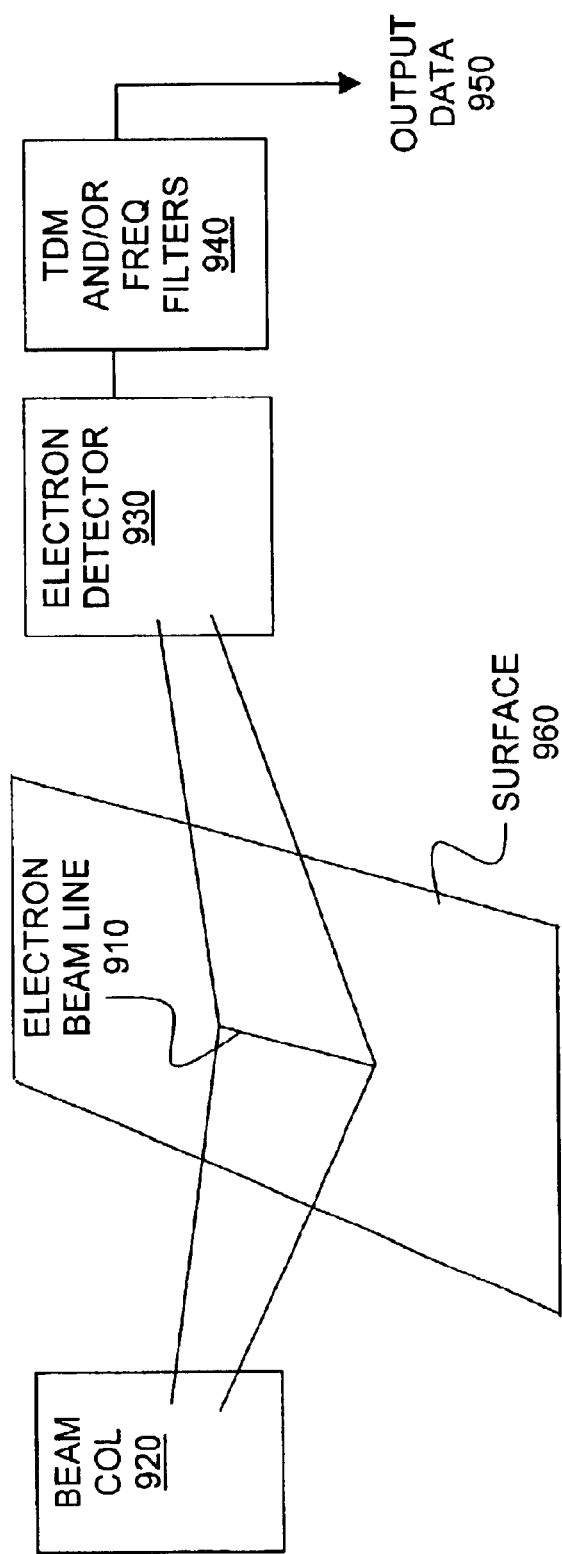
FIG. 9 illustrates one embodiment of a multi-line inspection system.

FIG. 9 illustrates one embodiment of the present invention for multi-beam inspection. Beam column 920 generates a beam line 910. Beam line 910 is incident on surface 960 causing secondary electrons to be emitted. Electron detector 930 detects the emitted electrons. In order to make any sense of the output data 950, and to correlate emitted electrons to particular positions on surface 960, some sort of filters 940 are used.

Any number of filtering techniques can be used. In one embodiment, filters 940 comprise a time division multiplexing (TDM) circuit. Each beam segment in beam line 910 is assigned a particular time slot in a repeating order. A particular beam segment is only on during its time slot. Filters 940 are synchronized to the time slots assigned to each beam segment. In which case, electrons detected during a particular time slot are correlated to a position on surface 960 corresponding to the appropriate beam segment.

In another embodiment, the voltages applied to the conductor pads in the micro-blanker are modulated with certain frequency signatures. A different frequency signature can be assigned to each conductor pad. In which case, filters 940 comprise a number of frequency filters. Each filter only passes data corresponding to one of the unique frequency signatures, thereby identifying electrons emitted by a particular beam segment.

In yet another embodiment, a combination of time division multiplexing and frequency signatures are used. For instance, rather than using 50 thousand different frequency signatures and frequency filters for a blanker with 50 thousand beam segments, beam segments could be assigned to one of a thousand different time slots and one of 50 different frequency signatures, or some variation thereof.

All of the embodiments and examples so far have described various ways to provide large numbers of beams to cover comparatively large areas. Embodiments of the present invention also include various ways to improve the quality of individual beam segments and the quality of the images that can be written and scanned using micro-blanker arrays.

Image quality depends on a number of factors, not the least of which is beam segment uniformity. If beam segments have different dose rates, their beam sizes will be different due to Coulomb interaction. If the beam sizes are different, images will be distorted because feature edges will not be uniformly placed. Unfortunately, an electron beam is very unlikely to be uniform over the entire beam line length.

Figure 10:
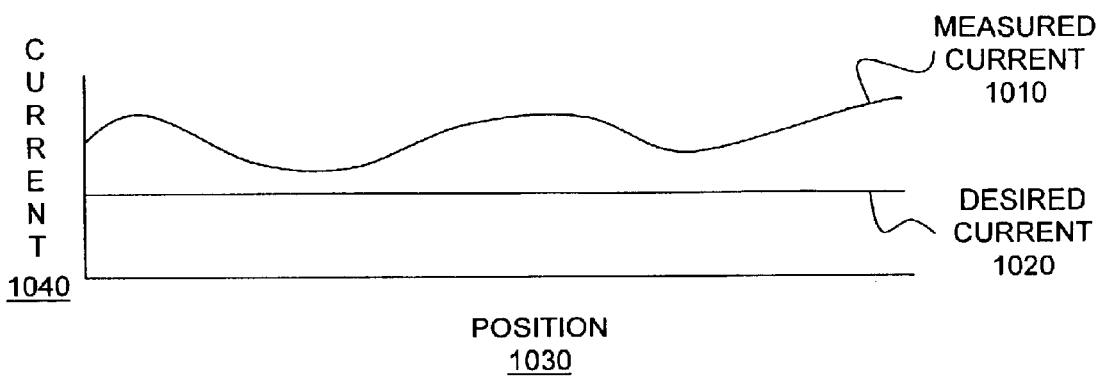
FIG. 10 illustrates one embodiment of an electron current profile.

Using a system like the one described in FIG. 9, a beam segment profile can be measured. FIG. 10 illustrates an example beam profile measured in terms of current 1040. In the measured current curve 1010, a current value 1040 is plotted separately for each beam segment position 1030 in a beam line. The measured current fluctuates over the length of the beam line.

It may be difficult to increase the current of individual segments. So, in the illustrated embodiment, a desired current level 1020 is selected at some level below the measured curve 1010 and the individual segments are attenuated down to the desired level. In one embodiment, the desired level 1020 is equal to the lowest measured current. In other embodiments, the desired level is below the lowest measured level by some error margin.

Figure 11:
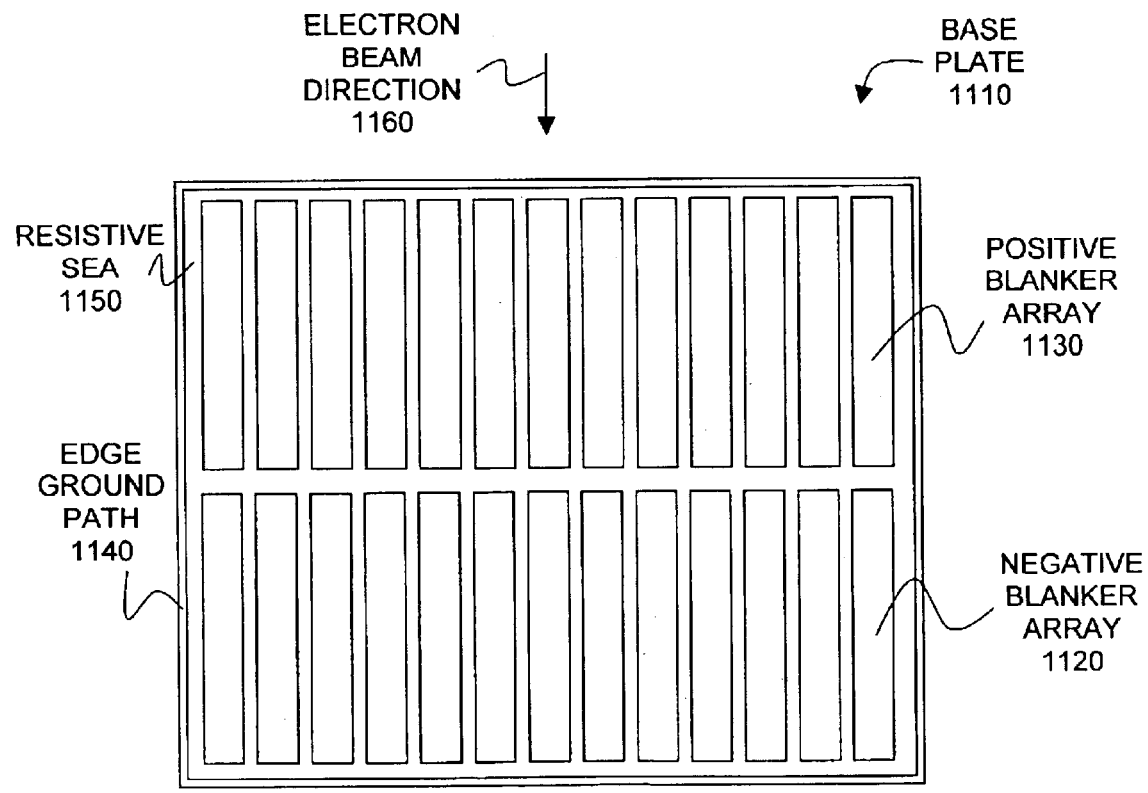
FIG. 11 illustrates one embodiment of a beam segment attenuator.

Any number of approaches can be used to attenuate individual beam segments. FIG. 11 illustrates one example using two arrays of conductor pads, 1120 and 1130, on a base plate 1110. Like the array from FIG. 1, a ground plate (not shown) mounts to base plate 1110 over conductor arrays 1120 and 1130 to form a gap. Circuitry (not shown) can selectively apply a range of voltages to each of the conductor pads. In the illustrated embodiment, the circuitry can apply negative voltages to array 1120 and positive voltages to array 1130. The ground plate provides a grounded region over the conductor pads so that each conductor pad can generate an electric field across the gap. Both arrays 1120 and 1130 are arranged perpendicular to an electron beam direction 1160. Each conductor pad in array 1120 has a counter-part conductor pad in array 1130 such that the two pads are in series relative to the electron beam direction. The conductor pads in at least one of the arrays are long enough to at least partially deflect electrons to the conductor pad or the ground plate depending on the level of voltage applied.

As a stream of electrons pass by a conductor pad in array 1130, the beam can be attenuated by applying a voltage level that partially deflects the stream. Since array 1130 receives positive voltages in FIG. 11, the electrons are drawn to the conductor pad. Those electrons that connect with the pad are removed from the stream. As the remaining electrons pass by the corresponding conductor pad in array 1140, the appropriate negative voltage repeals the electrons just enough to return the stream to its original path through the aperture. By adjusting the positive and negative voltages applied to series pairs of conductor pads, each beam segment can be attenuated to, or near, the desired uniform current level.

In other embodiments, the positive and negative voltages can be applied to attenuate individual beam segments in any of a variety of ways. For instance, a negative voltage could be applied first. The negative voltage could be used to deflect electrons into the ground plate to attenuate the beam segment rather than drawing the electrons to the conductor pad. Also, rather than applying all negative voltages to one array and all positive voltages to the other, positive and negative voltages could be applied to different conductor pads within the same array. This approach can help to distribute captured electrons over a larger area.

Furthermore, to reduce charge build-up from accumulated electrons, the embodiment of FIG. 11 includes a resistive sea 1150 surrounding the conductor pads as well as a ground path 1140 along the edges of base plate 1110. Resistive sea 1150 can leak off accumulated charge from the conductor pads to ground path 1140.

In one embodiment, in addition to positive and negative voltages to attenuate beam segments, the circuitry also provides a blanker voltage. For instance, to turn off a beam segment, at least one of the series pairs of conductor pads receives an additional positive or negative voltage to deflect the beam segment from the aperture. Alternatively, applying the blanker voltage may involve turning off one of the positive or negative voltages and leaving the other voltage on. In either case, the positive and negative voltages can be manipulated not only to attenuate beam segments, but also to blank beam segments.

Figure 12:
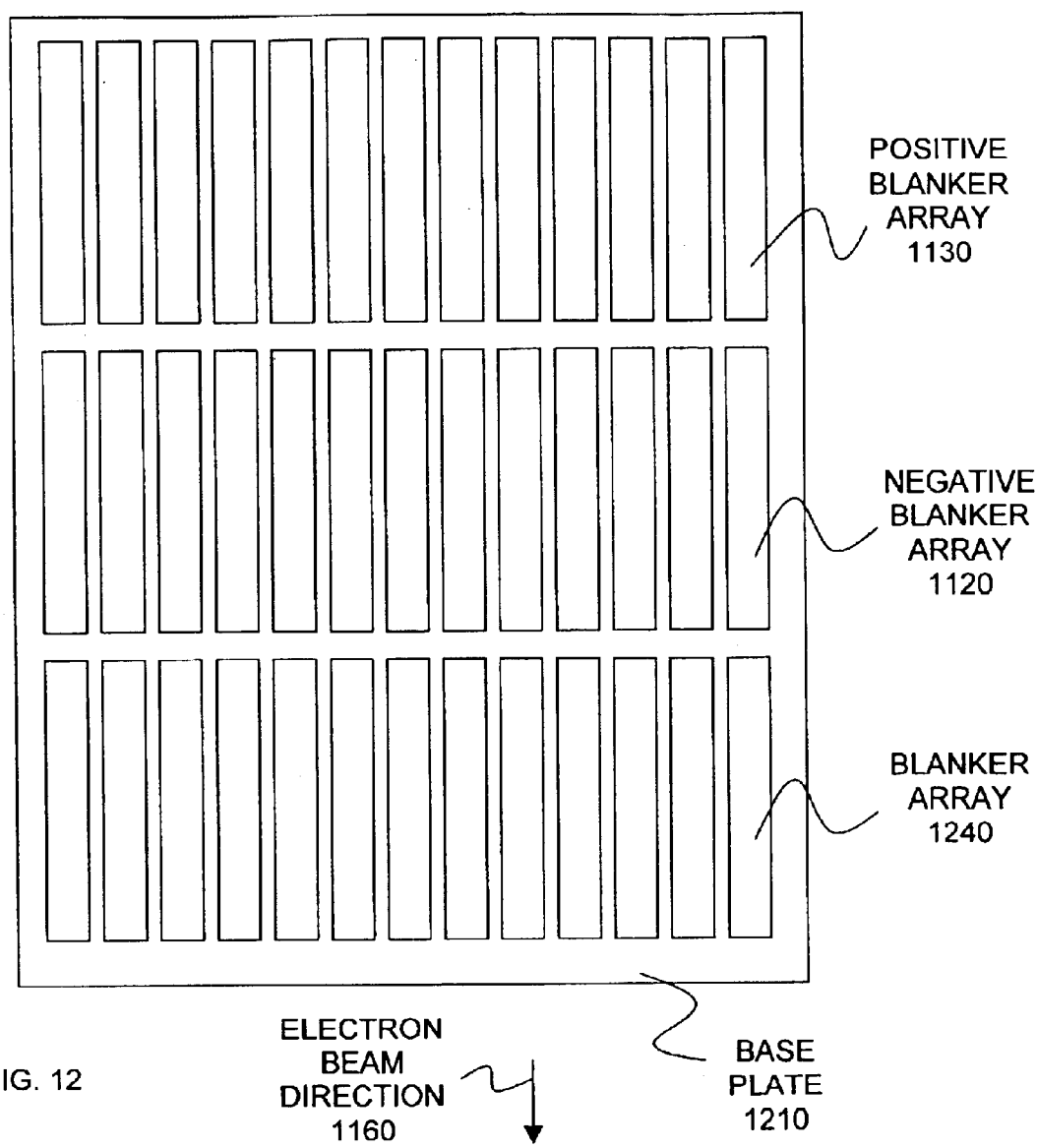
FIG. 12 illustrates one embodiment of a beam segment attenuator with a separate blanker array.

In another embodiment, as shown in FIG. 12, rather than using just arrays 1120 and 1130, base plate 1210 includes a separate, third blanker array 1240 to apply the blanker voltages. This embodiment may help, for instance, to simplify the circuitry used to apply the voltages.

Figure 13:
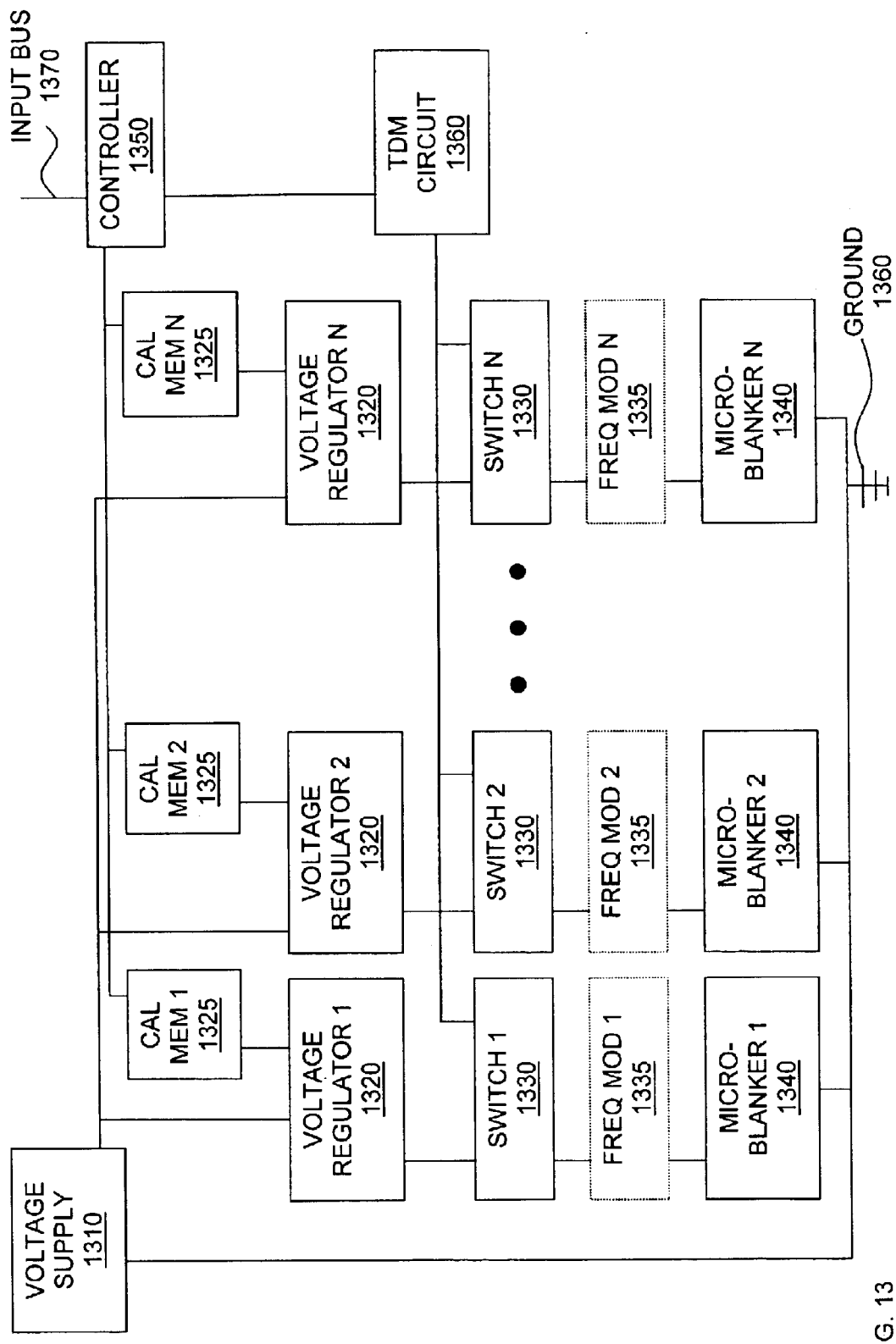
FIG. 13 illustrates one embodiment of circuitry for applying voltages to conductor pads.

FIG. 13 illustrates one embodiment of circuitry that could be used to apply the various voltages to the individual micro-blankers. In the illustrated embodiment, a voltage supply 1310 provides a certain voltage level to an array of N voltage regulators 1320. Each regulator 1320 can provide a range of voltage levels. The voltage level from each of the regulators 1320 is provided to one of N switches 1330. Each switch 1330 selectively applies the voltage to one of N micro-blankers 1340. Each micro-blanker comprises one conductor pad separated from a ground plate by a gap, forming a capacitive element. The ground plate is connected to a common ground 1360 to close the circuit. Pairs of micro-blankers are arranged in series as discussed above with respect to FIG. 11. A controller,1350 controls the N switches 1330 to either apply voltage to respective micro-blankers 1340 or not.

To calibrate the system, the regulators 1320 are first set to provide a blanker voltage with no attenuation for each beam segment, and the switches 1330 are set for an inspection mode. In the inspection mode, each beam segment is turned on, electrons are emitted from a surface and detected, and beam segment currents are measured.

In one embodiment, a time division multiplexing (TDM) circuit 1360 is used to distinguish among the beam segments when measuring currents. That is, pairs of series micro-blankers 1340 are assigned to particular time slots and each pair passes its corresponding beam segment only during its assigned time slot. In an alternative embodiment, rather than including a separate TDM circuit, control circuit 1350 could be externally directed through input bus 1370 to perform the TDM function.

In another embodiment, switches 1320 are set to pass all of the beam segments simultaneously. In which case, frequency modulators 1335 can mark each beam segment with a unique frequency signature so as to distinguish electrons from among the various beam segments. In the illustrated embodiment, each micro-blanker 1340 has a corresponding frequency modulator 1335. In an alternative embodiment, only one frequency modulator 1335 is needed for each series pair of micro-blankers.

In yet another embodiment, some combination of frequency signatures and TDM assignments are used to identified particular electrons.

Based on the measured currents, calibration values can be determined and supplied to controller 1350 through input bus 1370. Controller 1350 writes the calibration values to respective calibration memory locations 1325. Each calibration value indicates a voltage level for a corresponding voltage regulator 1320 to generate. Then, the beam segment currents can be measured again and compared to the desired current level.

Once the regulators 1320 have been set to generate a calibration voltage, it may be difficult in the illustrated embodiment to selectively apply a blanker voltage to individual segments. That is, in the illustrated embodiment, only one voltage is available for each blanker at a time, so an additional blanker voltage cannot be applied. Calibration voltages are used in pairs, with a positive voltage applied to one conductor pad in series and a negative voltage applied to the other. In this case, a beam segment may be blanked by turning off one of the two voltages, thereby deflecting the beam segment from the aperture.

In other embodiments, additional circuitry could be added to make a calibration voltage and a blanker voltage available in the alternative. Or, the micro-blankers 1340 could be arranged in groups of three in series, with calibration voltages applied to two of the blankers and a blanker voltage applied to the third blanker.

The blanker array may go through several iterations of measurements and calibration values until acceptable levels of attenuation are achieved for all beam segments. Calibration may be repeated from time to time and/or as certain conditions change.

In order to write an image, data can be fed to controller 1350 through input bus 1370. The data can instruct controller 1350 which beam segments to turn on and off, and when, as the beam line is swept over a surface. The data may be downloaded and stored on-chip by controller 1350. Alternatively, the data may be provided to controller 1350 in real time.

Figure 15:
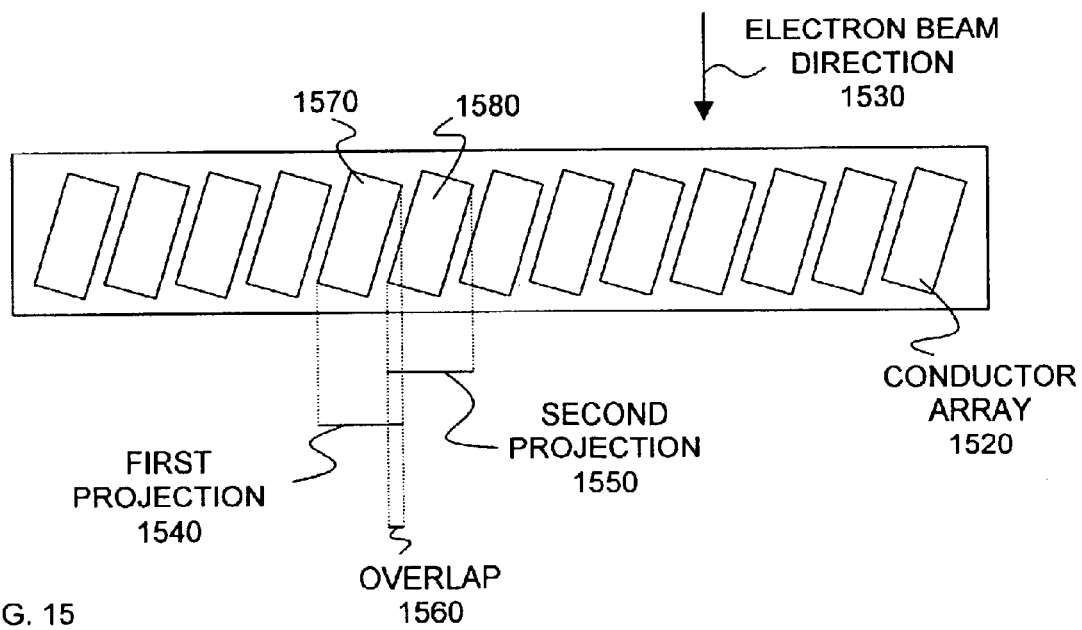
Figure 16:
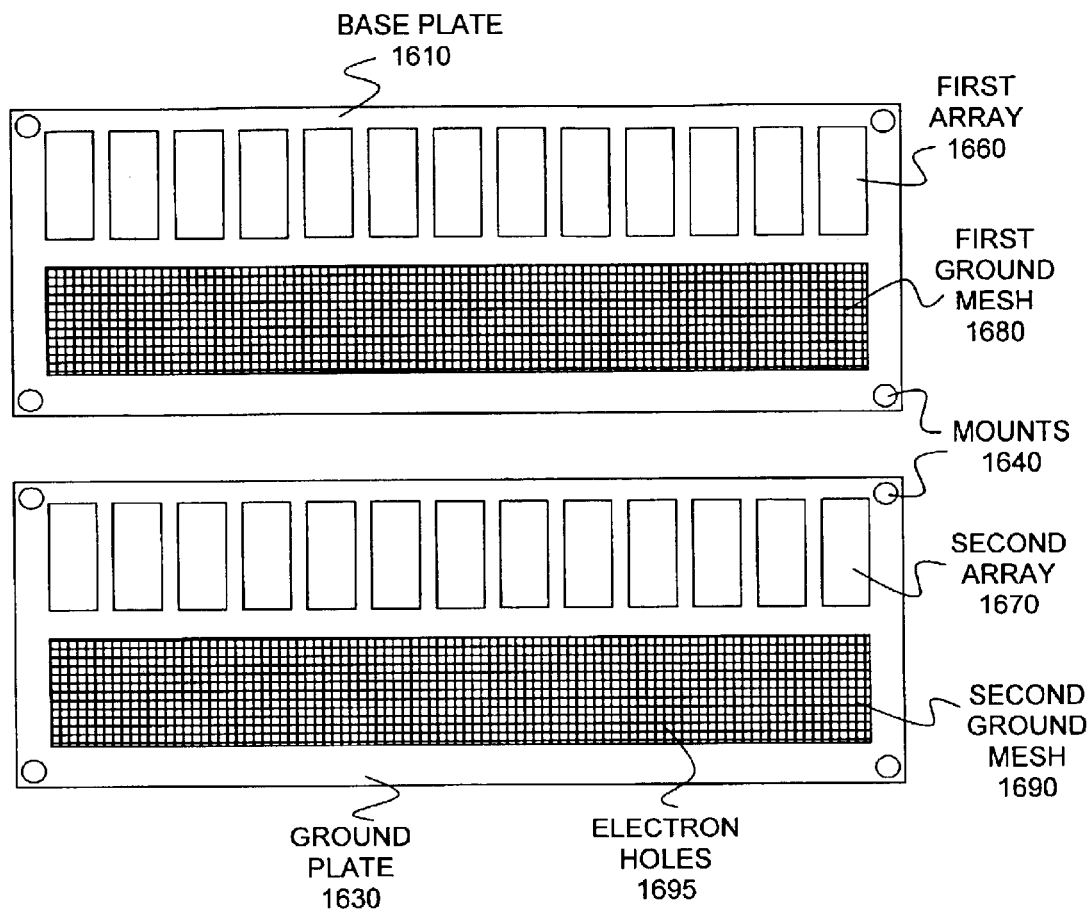

Each of the embodiments illustrated in FIGS. 1–13 include a number of implementation specific details. Alternative embodiments may not include all of the illustrated elements, may include additional elements, may combine one or more elements, may arrange elements in different configurations, and the like. For instance, FIGS. 14–16 illustrate various alternative embodiments of the inventive conductor pad arrays.

A conductor pad array like the one illustrated in FIG. 1 has limited resolution. That is, when a feature is drawn using the blanker array from FIG. 1, edges of the feature must correspond to one of the conductor pads. The resolution of the feature is only as fine as the number of conductor pads in the array.

Figure 14:
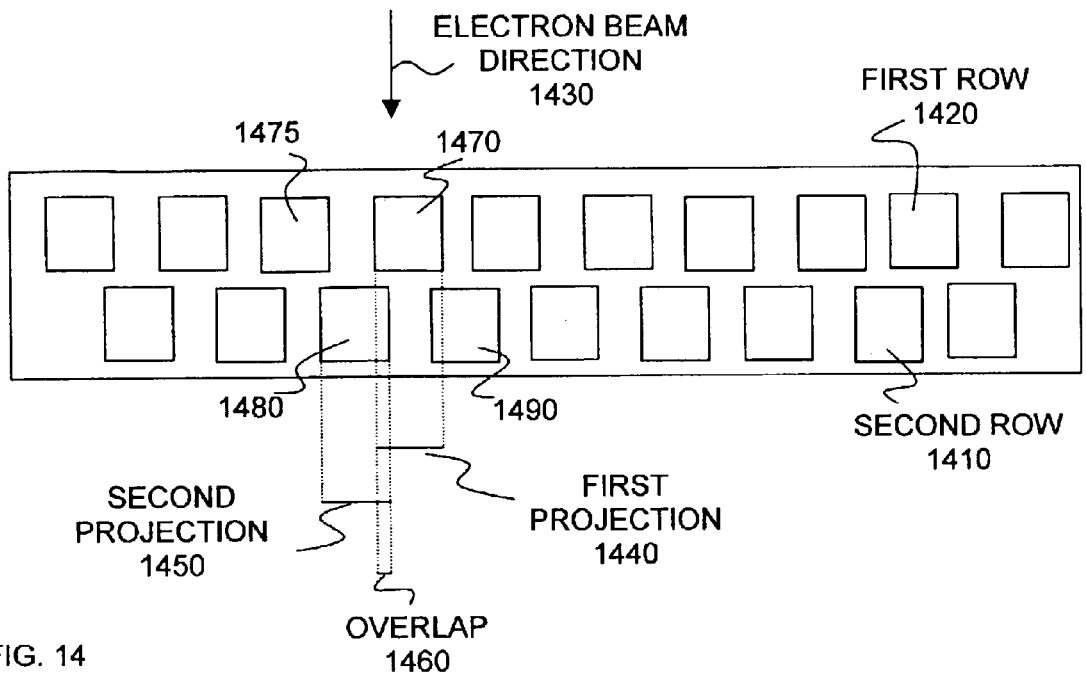
FIGS. 14–16 illustrate alternative array embodiments.

In FIG. 14 however, the conductor pads are arranged in a first row 1420 and a second row 1410. The rows are staggered such that a projection 1440 of a conductor pad 1470 in the electron beam direction 1430 has an overlap 1460 with a projection 1450 of at least one neighbor conductor pad 1480.

The overlap 1460 can greatly improve the resolution. For instance, by applying no blanker voltage to 1470 and maximum blanker voltage to 1480 and 1490, a narrower beam segment is passed. The narrower beam segment comprises only that part of the beam that does not get diverted by 1480 or 1490. Furthermore, by decreasing the blanker voltage on 1480 to some intermediate level while maintaining maximum blanker voltage on 1475, the beam segment edge expands in the direction of 1480. By manipulating voltage levels on neighboring conductor pads in this fashion, beam segment edges can be placed with much greater precision. Other embodiments may include additional rows of staggered and overlapping pads to provide even finer resolution.

FIG. 15 illustrates another embodiment of overlapping projections. Each conductor pad in array 1520 is oriented at an angle with respect to the electron beam direction 1530. A projection 1540 of a conductor pad 1570 has an overlap 1560 with a projection 1550 of at least one neighbor conductor pad 1580. As with the embodiment of FIG. 14, voltages applied to neighboring conductor pads can be manipulated to adjust beam segment placement and increase resolution. Other embodiments may use longer conductor pads and steeper angles to increase the extend and/or number of overlapping pads, and increase the resolution as a result. Any number of approaches can be used to manipulate voltages in array embodiments like those of FIGS. 14 and 15.

FIG. 16 demonstrates that not all of the conductor pads need to be on one plate. In FIG. 16, a base plate 1610 and a ground plate 1630 are laid open to show the internal structures that match up when the plates are assembled. Mount A 1640 on base plate 1610 couples with mount A 1640 on base plate 1630 to form a gap between the plates. First array 1660 forms micro-blankers with second ground mesh 1690. Second array 1670 forms micro-blankers with first ground mesh 1680. Dividing the conductor pads between the two plates may help to, for instance, better distribute captured electrons, provide more space for control and support circuitry, and the like.

The illustrated embodiment also shows that ground mesh 1690 includes electron holes 1695. The electron holes are intended to capture secondary electrons. That is, as electrons from the beam source strike the conductor pads, the conductor pads are likely to emit secondary electrons. The secondary electrons can careen off in odd angles, potentially interfering with the beam segment size and shape. Electron holes reduce the number of secondary electrons that escape the blanker array.

Example Embodiments for Making the Blanker Array

Figure 17A:
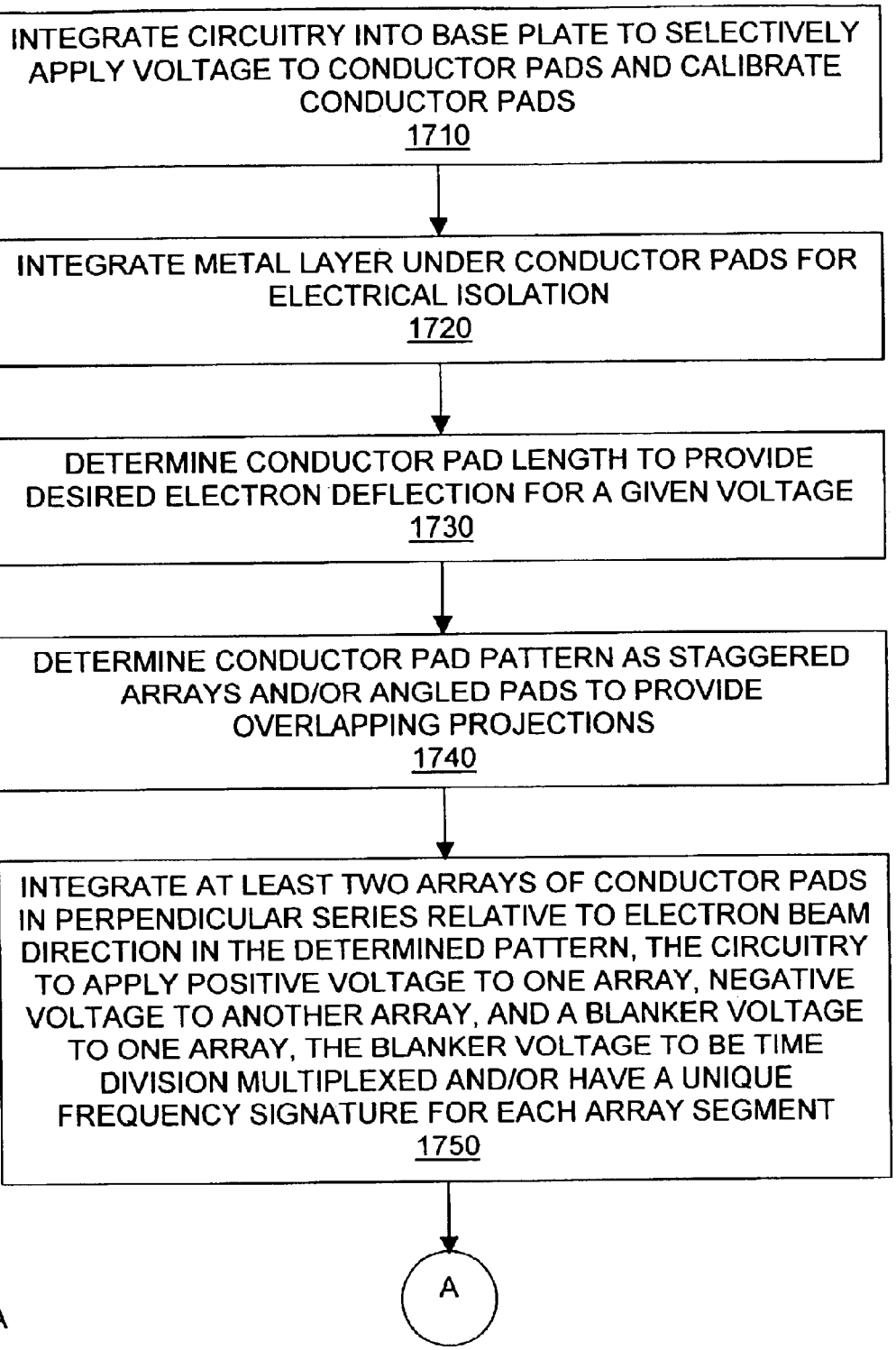
FIGS. 17A and 17B demonstrate one embodiment of making the inventive blanker array.
Figure 17B:
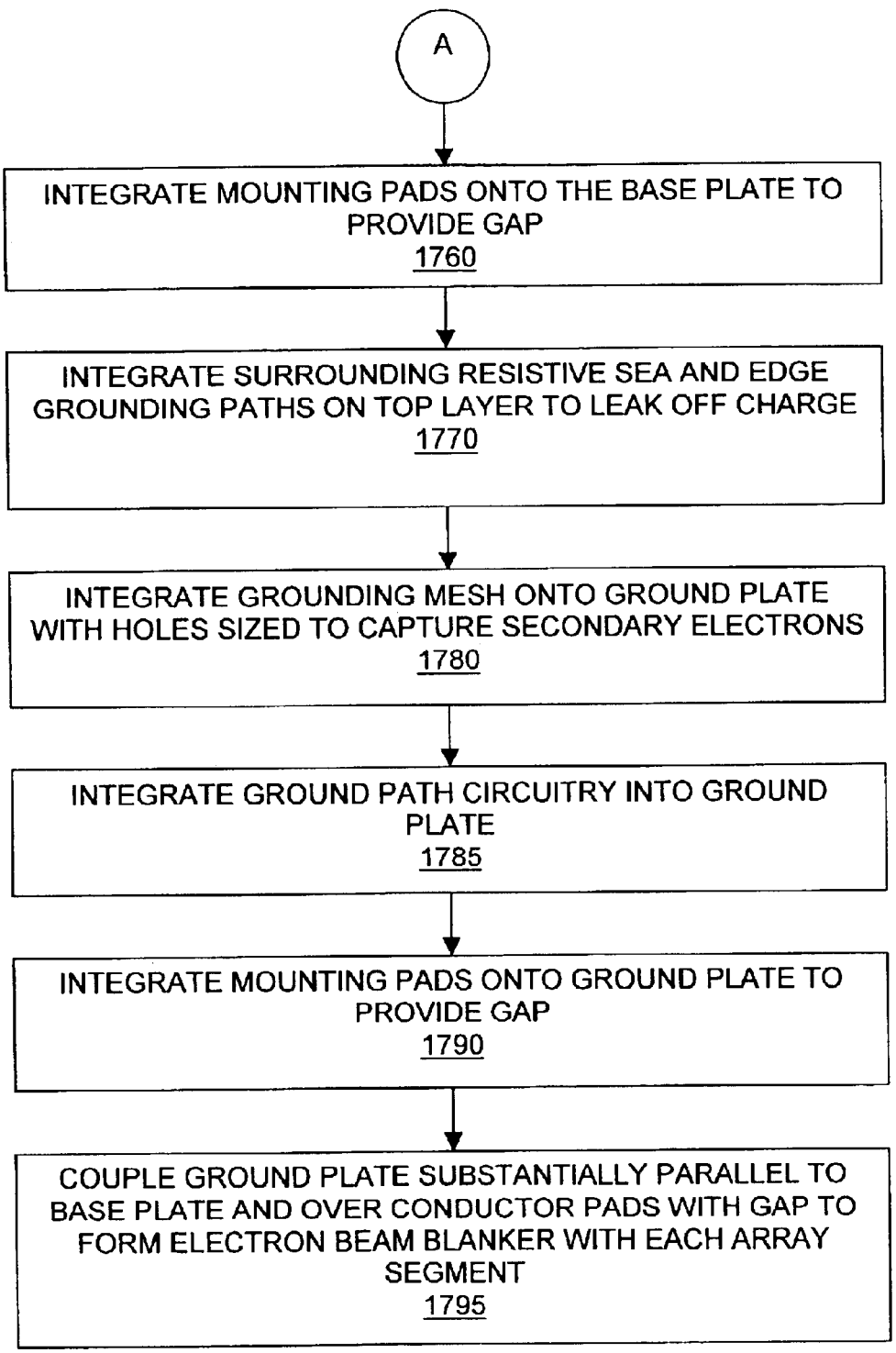

FIGS. 17A and 17B demonstrate one embodiment of how the inventive blanker array can be made. In general, making the blanker array involves forming the one-dimensional array of conductor pads on one or two plates and coupling two plates together, separated by a gap and with a grounded area across the gap from each conductor pad. The illustrated embodiment includes a number of implementation specific details.

First, at 1710, circuitry is integrated into a base plate. The circuitry can selectively apply voltage to individual conductor pads and calibrate individual conductor pads. At 1720, a metal layer is integrated into the base plate below where the conductor pads will be. The metal layer can provide some electrical isolation between pads. At 1730, the length of the conductor pads is determined. In reality, this step would normally have occurred long before the previous two steps. It is included here in the illustrated embodiment merely to show that, for a given voltage level that can be applied to the conductor pads, a particular length of conductor is needed to adequately defect a beam segment.

At 1740, a pattern is determined for the conductor pads. Again, this step would normally occur long before steps 1710 and 1720, but it is included here to show that the conductor pad pattern can take a variety of forms, such as staggered and/or angled.

At 1750, the conductor pads are integrated onto the base plate. In the illustrated embodiment, at least two arrays or rows of conductor pads are used so that the beam line can be calibrated. That is, pairs of pads are arranged in series with respect to the direction of the electron beam. The circuitry from 1710 can selectively apply positive voltage to one pad in a series pair and a negative voltage to the other pad to attenuate individual segments of the beam line. And, as discussed above, the circuitry can also apply a blanker voltage to individual segments, as well as time division multiplex and/or apply a frequency signature to individual segments.

At 1760, mounting pads are integrated onto the base plate to provide the gap. Other embodiments may put the mounting pads only on the ground plate. At 1770, a surrounding resistive sea and edge grounding paths are integrated on a top layer of the base plate to leak off charge that may build up when electrons are incident on the blanker.

At 1780, a grounding mesh is integrated on the ground plate. In the illustrated embodiment, the mesh is designed with holes sized to capture secondary electrons that may be emitted when electrons are incident on the blanker. At 1785, ground path circuitry is integrated into the ground plate. 1790, mounting pads are integrated onto the ground plate to provide the gap. Other embodiments may put the mounting pads only on the base plate.

Finally, at 1795, the ground plate and the base plate are coupled together. Any number of techniques can be used to bond the two plates, including solder and/or adhesive. In the illustrated embodiment, the plates are substantially parallel. The ground plate covers the arrays of conductor pads forming an electron beam blanker across the gap for each array segment of at least two series conductor pads.

Figure 18:
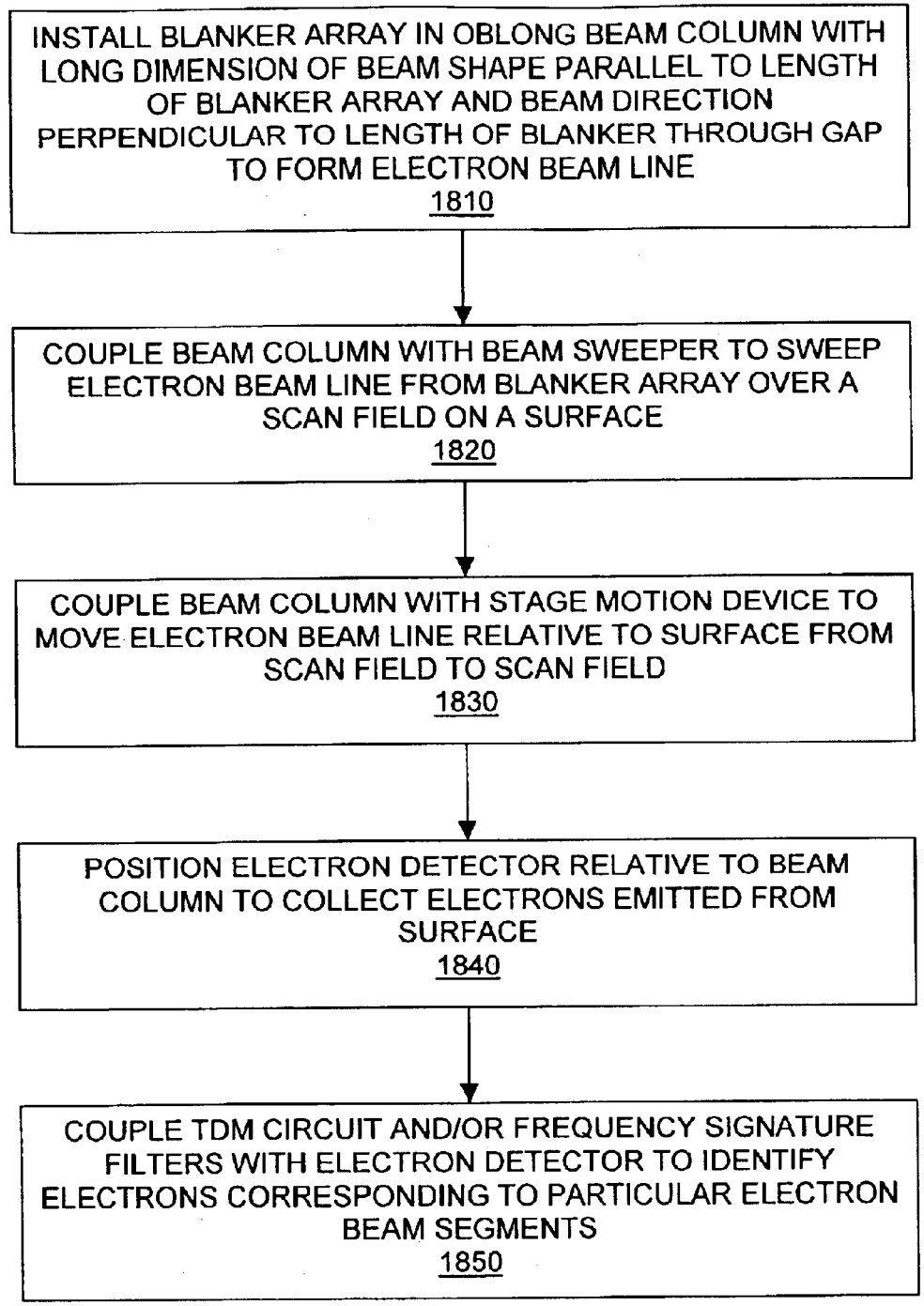
FIG. 18 demonstrates one embodiment of making a beam system that includes the inventive blanker array.

FIG. 18 demonstrates one embodiment of making a beam system that includes the inventive blanker array. In general, the inventive blanker array can be used in any of a wide variety of beam systems. The illustrated embodiment includes a number of implementation specific details.

First, at 1810, the blanker array is installed in a beam column so that the beam passes through the gap in the blanker array to form the beam line. That is, the direction of the beam is perpendicular to the length of the blanker array. The cross-section of the beam is oblong and is oriented such that the long dimension of the cross-section is substantially parallel to the length of the blanker array.

At 1820, the beam column is coupled with a beam sweeper. The beam sweeper can sweep the beam line over a scan field on a surface. At 1830, the beam column is coupled with a stage motion device. The stage motion device can move the beam line from scan field to scan field.

At 1840, an electron detector is positioned relative to the beam column to collect electrons emitted from the surface due to the beam line. At 1850, a filter is coupled to the electron detector. In the illustrated embodiment, the filter is a time division multiplexing circuit and/or frequency signature filters to identify electrons corresponding to particular segments of the beam line.

Example Embodiments for Using the Blanker Array

Figure 19:
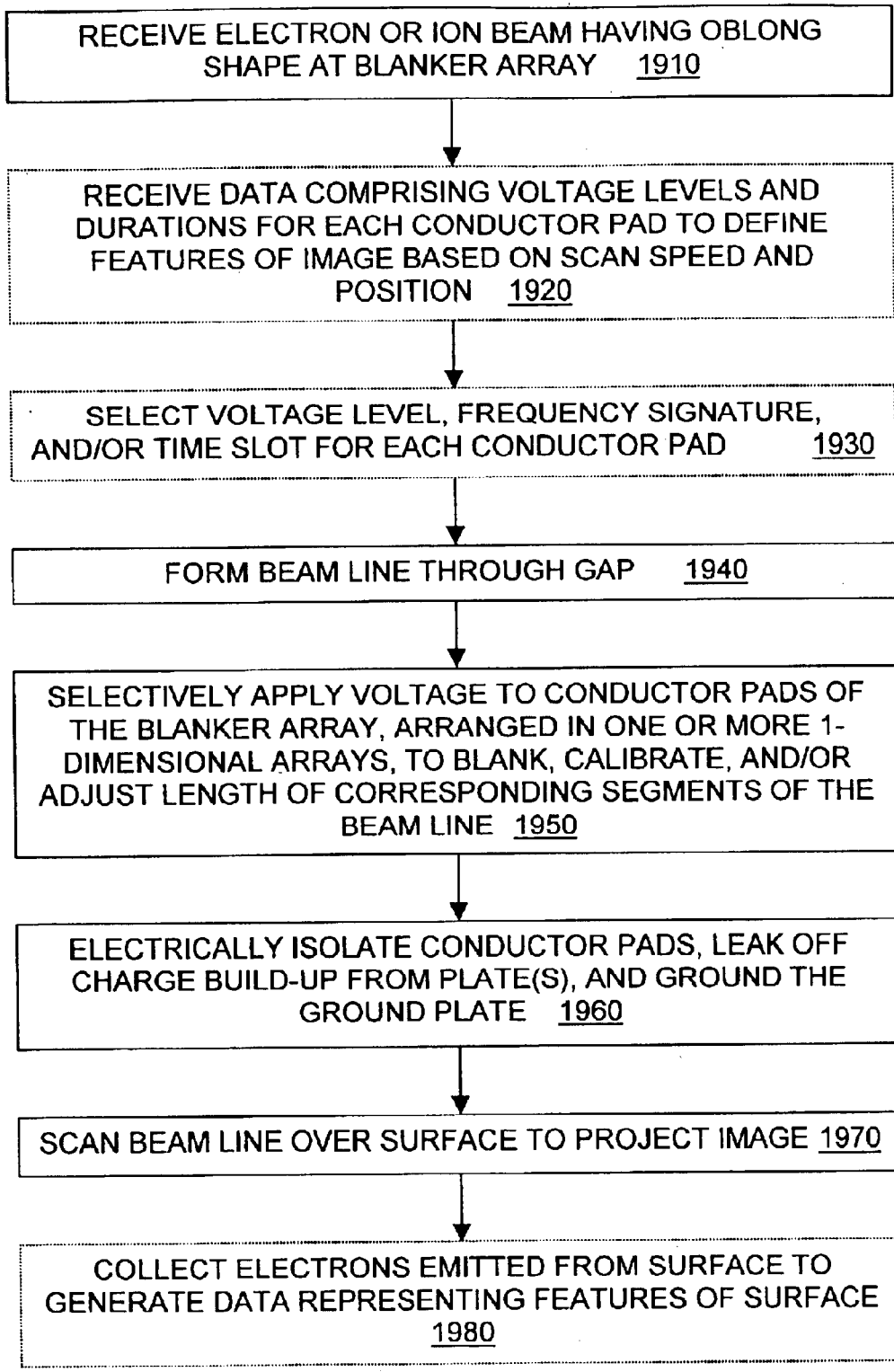
FIG. 19 demonstrates one embodiment of using the inventive blanker array.

FIG. 19 demonstrates one embodiment for using the inventive blanker array. In general, the blanker array can be used for a number of applications, including inspection and image writing, by scanning a beam line over a surface and selectively modulating and/or identifying individual beam segments. The illustrated embodiment includes a number of implementation specific details.

First, at 1910, a beam is received. A variety of different beams could be used, including both electron beams and ion beams. In the illustrated embodiment, the beam has an oblong shape to concentrate more of the beam into the gap of the blanker compared to a circular beam shape.

Assuming the blanker array is being used to write an image, data are received at 1920 that define the features of the image to be written. In the illustrated embodiment, the data include voltage levels and durations for each voltage level for each conductor pad of the blanker array as the beam line scans across a surface. The durations are based on the positions of features and speed of the scan. The data may also define calibration levels for each conductor pad.

At 1930, assuming the blanker array is being used to inspect a surface, the beam segments are to be calibrated and individually identified. Calibration involves selecting a voltage level for each conductor pad. Identifying the beam segments involves assigning time slots and/or frequency signatures to beam segments.

At 1940, the beam line is formed through the gap in the blanker array. At 1950, the previously selected voltages are individually applied to the respective conductor pads. For both writing and inspecting, the voltages can calibrate the beam segments. For inspecting, the voltages can individually identify beam segments. For writing, the voltages can blank individual beam segments, as well as adjust the length of individual beam segments in a system having overlapping beam projections from neighboring conductor pads.

At 1960, in the illustrated embodiment, the conductor pads are electrically isolated, charge that builds-up on the conductor pads is leaked off, and the ground areas on the ground plate are grounded during operation of the blanker array.

At 1970, the beam line is scanned over a surface. Assuming the blanker is being used to write, an image is projected during the scanning by modulating the voltages to the conductor pads.

At 1980, assuming the blanker is being used for inspection, electrons are collected that are emitted from the surface due to the beam line incident on the surface. The collected electrons can be used to generate data representing features of the surface. Other than the novel approaches described above for identifying particular electrons, any number of techniques can be used to generate the data defining the features of the surface.

Example Embodiments for Calibrating the Blanker Array

Figure 20:
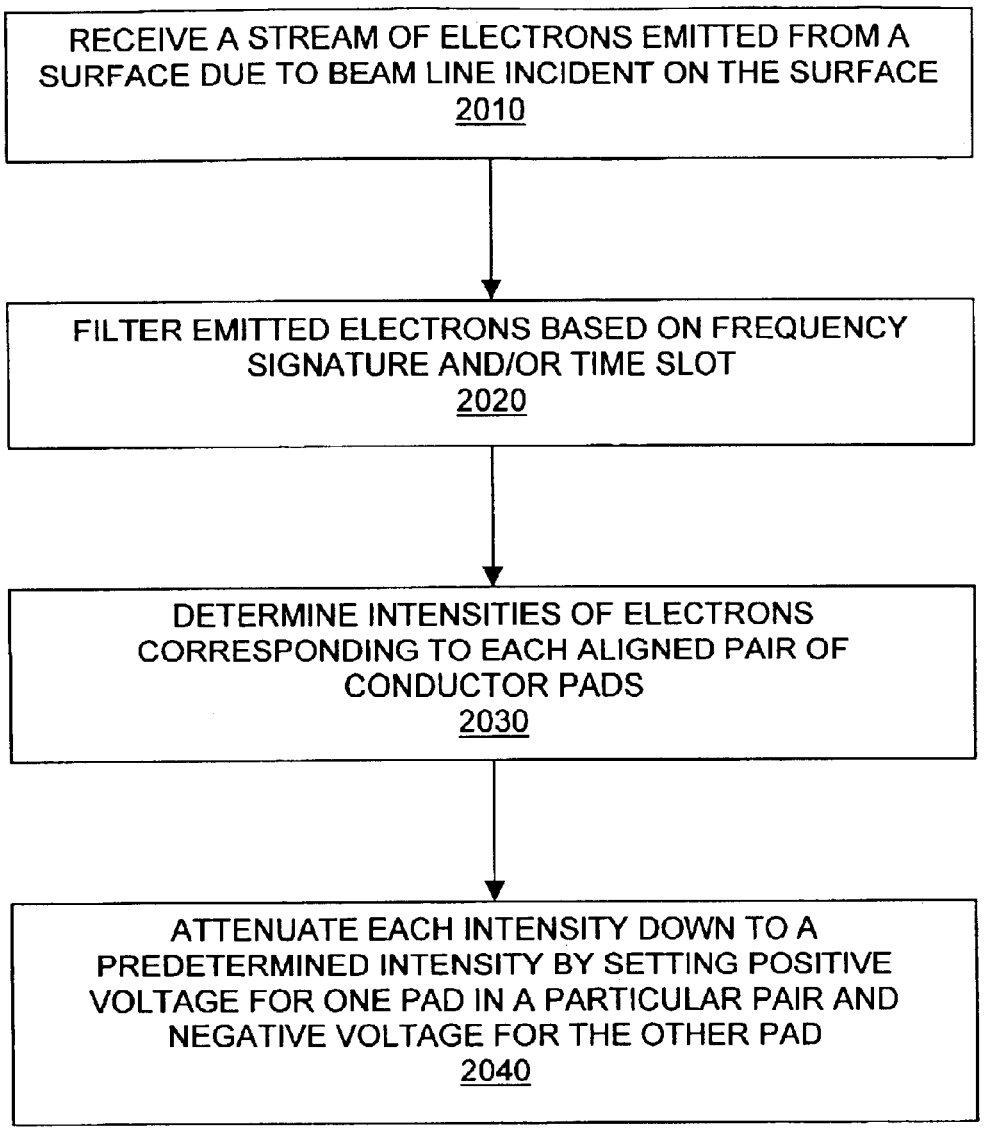
FIG. 20 demonstrates one embodiment of calibrating the inventive blanker array.

FIG. 20 demonstrates one embodiment for calibrating the inventive blanker array. At 2010, a stream of electrons is received. The electrons are emitted from a surface due to the beam line incident-on the surface. At 2020, the stream of electrons is filtered based on frequency signature and/or time slot to identify electrons corresponding to particular beam segments. A beam segment corresponds to at least two conductor pads arranged in series with respect to the beam direction of the beam line. At 2030, for electrons corresponding to each pair of conductor pads, the illustrated embodiment determines the intensity of the emitted electrons. Intensity could be measured in terms of electrical current. At 2040, each intensity is attenuated down to a predetermined level by setting a particular positive voltage level for one pad of a corresponding pair of conductor pads, and a particular negative voltage level for the other pad in the pair of conductor pads. Other embodiments may go through multiple iterations of receiving electrons, filtering the electrons, measuring intensities, and adjusting voltage levels to achieve the desired degree of uniformity among the beam segments.

Example Hardware System for Implementing the Methods

Figure 21:
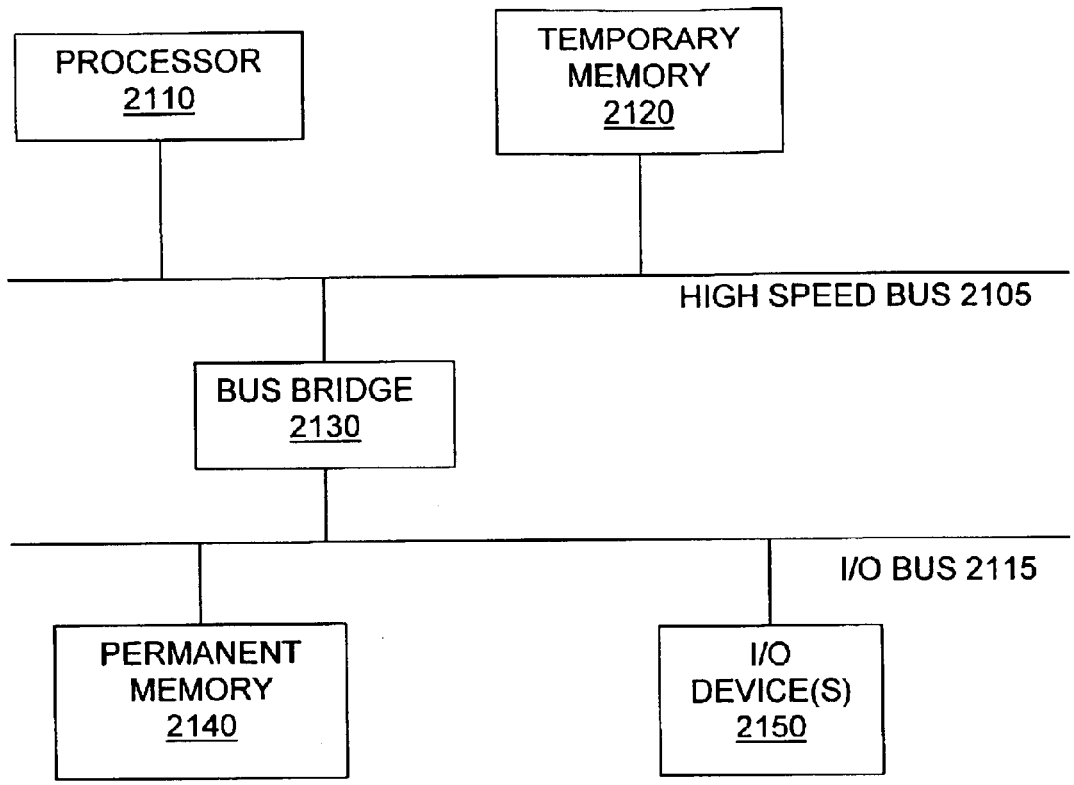
FIG. 21 illustrates one embodiment of a generic hardware system.

FIG. 21 illustrates one embodiment of a hardware system intended to represent a broad category of computer systems such as personal computers, workstations, and/or embedded systems. In the illustrated embodiment, the hardware system includes processor 2110 coupled to high speed bus 2105, which is coupled to input/output (I/O) bus 2115 through bus bridge 2130. Temporary memory 2120 is coupled to bus 2105. Permanent memory 2140 is coupled to bus 2115. I/O device(s) 2150 is also coupled to bus 2115. I/O device(s) 2150 may include a display device, a keyboard, one or more external network interfaces, etc.

Certain embodiments may include additional components, may not require all of the above components, or may combine one or more components. For instance, temporary memory 2120 may be on-chip with processor 2110. Alternately, permanent memory 2140 may be eliminated and temporary memory 2120 may be replaced with an electrically erasable programmable read only memory (EEPROM), wherein software routines are executed in place from the EEPROM. Some implementations may employ a single bus, to which all of the components are coupled, or one or more additional buses and bus bridges to which various additional components can be coupled. Those skilled in the art will be familiar with a variety of alternate internal networks including, for instance, an internal network based on a high speed system bus with a memory controller hub and an I/O controller hub. Additional components may include additional processors, a CD ROM drive, additional memories, and other peripheral components known in the art.

In one embodiment, the present invention, as described above, is implemented using one or more hardware systems such as the hardware system of FIG. 21. Where more than one computer is used, the systems can be coupled to communicate over an external network, such as a local area network (LAN), an Internet protocol (IP) network, etc. In one embodiment, the present invention is implemented as software routines executed by one or more execution units within the computer(s). For a given computer, the software routines can be stored on a storage device, such as permanent memory 2140.

Figure 22:
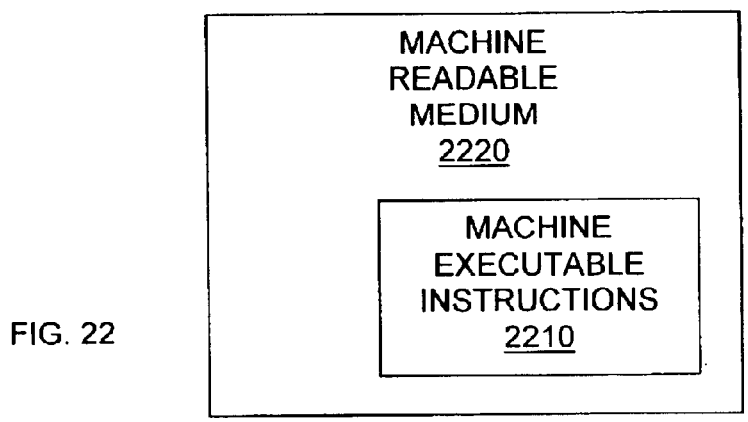
FIG. 22 illustrates one embodiment of a machine-readable medium to store executable instructions for embodiments of the present invention.

Alternately, as shown in FIG. 22, the software routines can be machine executable instructions 2210 stored using any machine readable storage medium 2220, such as a diskette, CD-ROM, magnetic tape, digital video or versatile disk (DVD), laser disk, ROM, Flash memory, etc. The series of instructions need not be stored locally, and could be received from a remote storage device, such as a server on a network, a CD ROM device, a floppy disk, etc., through, for instance, 110 device(s) 2150 of FIG. 21.

From whatever source, the instructions may be copied from the storage device into temporary memory 2120 and then accessed and executed by processor 2110. In one implementation, these software routines are written in the C programming language. It is to be appreciated, however, that these routines may be implemented in any of a wide variety of programming languages.

In alternate embodiments, the present invention is implemented in discrete hardware or firmware. For example, one or more application specific integrated circuits (ASICs) could be programmed with one or more of the above described functions of the present invention. In another example, one or more functions of the present invention could be implemented in one or more ASICs on additional circuit boards and the circuit boards could be inserted into the computer(s) described above. In another example, field programmable gate arrays (FPGAs) or static programmable gate arrays (SPGA) could be used to implement one or more functions of the present invention. In yet another example, a combination of hardware and software could be used to implement one or more functions of the present invention.

Thus, a one-dimensional beam blanker array is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. An apparatus comprising:
   a base plate;
   a plurality of conductor pads arranged in a one-dimensional array on the base plate; and
   a ground plate coupled to the base plate over the plurality of conductor pads with a gap between the base plate and the ground plate to form a beam blanker with each of the plurality of conductor pads.

2. The apparatus of claim 1 wherein at least one of the base plate and the ground plate comprises an integrated circuit chip.

3. The apparatus of claim 1, further comprising:
   circuitry to selectively apply a voltage to the plurality of conductor pads.

4. The apparatus of claim 3 wherein the circuitry is integrated into the base plate.

5. The apparatus of claim 3 wherein the voltage applied to a given conductor pad comprises a unique frequency signature among the plurality of conductor pads.

6. The apparatus of claim 3 wherein the voltage applied to a given conductor pad is selectable within a range of voltages.

7. The apparatus of claim 1 further comprising:
   a resistive sea surrounding the plurality of conductor pads on the base plate, said resistive sea grounded along edges of the base plate to leak off charge build-up.

8. The apparatus of claim 1 further comprising:
   circuitry to ground at least a region of the ground plate that is aligned with the plurality of conductor pads.

9. The apparatus of claim 8 wherein the circuitry is integrated into the ground plate.

10. The apparatus of claim 1 wherein the plurality of conductor pads comprises a first array of conductor pads, the apparatus further comprising:
    a second array of conductor pads on the base plate, said second array being aligned with the first array in series relative to a beam direction, and said ground plate being coupled to the base plate over both the first array and the second array.

11. The apparatus of claim 10 further comprising:
    circuitry to selectively apply a voltage to the second array.

12. The apparatus of claim 11 wherein the circuitry is integrated into the base plate.

13. The apparatus of claim 10 further comprising:
    circuitry to apply positive voltage to one of the first array and the second array, and negative voltage to an opposite one of the first array and the second array.

14. The apparatus of claim 13 wherein the circuitry is calibrated to attenuate beam segments corresponding to each of the plurality of conductor pads of the first array to a predetermined current using the positive voltage and the negative voltage.

15. The apparatus of claim 14 wherein the circuitry is further to selectively apply a blanker voltage to at least one of the first array and the second array.

16. The apparatus of claim 14 further comprising:
    a third array of conductor pads on the base plate, said third array being aligned with the first array and the second array in series relative to the beam direction, said ground plate being coupled to the base plate over the first array, the second array, and the third array; and
    wherein the circuitry is further to selectively apply a blanker voltage to the third array.

17. The apparatus of claim 1 wherein each conductor pad in the plurality of conductor pads has a length in a beam direction that is long enough to at least partially deflect a beam to the respective conductor pad for a given applied voltage.

18. The apparatus of claim 1 wherein the plurality of conductor pads are arranged in the one-dimensional array in at least two rows staggered by a fraction of a blanker pitch such that a projection of a given conductor pad in a beam direction partially overlaps a projection of at least one neighboring conductor pad.

19. The apparatus of claim 1 wherein each of the plurality of conductor pads is arranged in the one-dimensional array at an angle to a beam direction such that a projection of a given conductor pad in the beam direction partially overlaps a projection of at least one neighboring conductor pad.

20. The apparatus of claim 1 further comprising:
    a plurality of mounting pads on at least one of the base plate and the ground plate, said plurality of mounting pads having a height to provide the gap between the base plate and the ground plate.

21. The apparatus of claim 20 wherein the mounting pads are integrated into at least one of the base plate and the ground plate.

22. The apparatus of claim 1 wherein the ground plate comprises:
    a grounding mesh having a plurality of holes sized to capture secondary electrons.

23. The apparatus of claim 1 wherein the plurality of conductor pads comprises a first array of conductor pads, the apparatus further comprising:
    a second array of conductor pads on the ground plate, said second array being aligned with the first array across the gap.

24. The apparatus of claim 23 further comprising:
    circuitry to ground each of the second array of conductor pads.

25. The apparatus of claim 23 further comprising:
    circuitry to apply a voltage to the second array of conductor pads.

26. The apparatus of claim 1 further comprising:
    a beam column coupled with the base plate, said beam column to project a beam through the gap and perpendicular to the one-dimensional array.

27. The apparatus of claim 26 wherein the beam has an oblong beam shape with a longer dimension parallel to a length of the one-dimensional array.

28. The apparatus of claim 1 further comprising:
    a scan mechanism to scan a beam line from the gap over a surface.

29. The apparatus of claim 28 wherein the scan mechanism comprises:
    a beam scanner to sweep the beam line over a scan field on the surface in a perpendicular motion relative to a length of the beam line; and
    a stage incrementer to incrementally advance to a new scan field on the surface in a parallel motion relative to the length of the beam line.

30. The apparatus of claim 28 wherein the scan mechanism comprises:
    a stage positioner to position the beam line to a particular vector location relative to the surface; and
    a beam scanner to sweep the beam line over a scan field at the particular vector location in a perpendicular motion relative to a length of the beam line.

31. The apparatus of claim 1 further comprising:
    a detector positioned relative to the base plate to receive electrons emitted from a surface due to a beam line incident on the surface after passing through the gap.

32. The apparatus of claim 31 wherein the detector comprises:
a plurality of filters corresponding to the plurality of conductor pads, each of the plurality of filters to pass electrons emitted from the surface due to a particular segment of the beam line based on a unique frequency signature corresponding to one of the plurality of conductor pads.

33. The apparatus of claim 31 further comprising:
a time division multiplexing (TDM) circuit, said TDM circuit to define a time slot for each of the plurality of conductor pads, wherein one of the plurality of conductor pads is to pass a particular segment of the beam line for each time slot.

34. The apparatus of claim 1 wherein each beam blanker is to deflect one of an electron beam and an ion beam.

35. The apparatus of claim 1 wherein the ground plate is coupled substantially parallel to the base plate along a length of the one-dimensional array, and substantially non-parallel along a beam direction.

36. An apparatus comprising:
a plurality of one-dimensional blanker arrays, each of the plurality of one-dimensional blanker arrays comprising a base plate, a plurality of conductor pads arranged in a one-dimensional array on the base plate, and a ground plate coupled to the base plate over the plurality of conductor pads with a gap between the base plate and the ground plate to form a beam blanker with each of the plurality of conductor pads; and
a plurality of beam sources, each of the plurality of beam sources coupled to a respective one of the one-dimensional blanker arrays to provide a beam line.

37. The apparatus of claim 36 wherein the plurality of one-dimensional blanker arrays are arranged in parallel with respect to one another and distributed along a line perpendicular to a length of each blanker array.

38. The apparatus of claim 36 wherein the plurality of one-dimensional blanker arrays are arranged in parallel with respect to one another and distributed along a line parallel to a length of each blanker array.

39. The apparatus of claim 36 wherein the plurality of one-dimensional blanker arrays are arranged in parallel with respect to one another, with a first subset of the plurality of one-dimensional blanker arrays distributed along a line perpendicular to a length of each blanker array, and with a second subset of the plurality of one-dimensional blanker arrays distributed along a line parallel to a length of at least one of the blanker arrays in the first subset.

40. A method comprising:
forming a plurality of conductor pads on a base plate, said plurality of conductor pads arranged in a one-dimensional array along the base plate; and
coupling a ground plate to the base plate and over the plurality of conductor pads with a gap to form a beam blanker with each of the plurality of conductor pads.

41. The method of claim 40 further comprising:
integrating circuitry into the base plate to selectively apply a voltage to the plurality of conductor pads.

42. The method of claim 40 further comprising:
integrating circuitry into the ground plate to ground the ground plate.

43. The method of claim 40 further comprising:
forming a resistive sea surrounding the plurality of conductor pads, said resistive sea grounded along edges of the base plate to leak off charge build-up.

44. The method of claim 40 wherein the plurality of conductor pads comprises a first array of conductor pads, the method further comprising:
forming a second array of conductor pads on the base plate, the second array being aligned with the first array in series relative to a beam direction, said ground plate being coupled to the base plate over both the first array and the second array.

45. The method of claim 44 further comprising:
integrating circuitry into the base plate to apply a positive voltage to one of the first array and the second array, and a negative voltage to an opposite one of the first array and the second array.

46. The method of claim 45 further comprising:
calibrating the circuitry to attenuate beam segments corresponding to each of the plurality of conductor pads in the first array to a predetermined current using the positive and the negative voltages.

47. The method of claim 46 wherein the circuitry is further to selectively apply a blanker voltage to at least one of the first array and the second array.

48. The method of claim 46 further comprising:
forming a third array of conductor pads on the base plate, said third array being aligned with the first array and the second array in series relative to the beam direction, said ground plate being coupled to the base plate over the first array, the second array, and the third array; and
wherein the circuitry is to selectively apply a blanker voltage to the third array.

49. The method of claim 40 wherein forming the plurality of conductor pads comprises:
determining a length for a given conductor pad in the plurality of conductor pads in an electron beam direction that is long enough to at least partially deflect an electron beam to the respective conductor pad for a given applied voltage.

50. The method of claim 40 wherein forming the plurality of conductor pads comprises:
arranging the plurality of conductor pads in the one-dimensional array in at least two rows that are staggered by a fraction of a blanker pitch such that a projection of a given conductor pad in a beam direction partially overlaps a projection of at least one neighboring conductor pad.

51. The method of claim 40 wherein forming the plurality of conductor pads comprises:
arranging the plurality of conductor pads in the one-dimensional array at an angle to a beam direction such that a projection of a given conductor pad in the beam direction partially overlaps a projection of at least one neighboring conductor pad.

52. The method of claim 40 further comprising:
forming a plurality of mounting pads on at least one of the base plate and the ground plate, said plurality of mounting pads having a height to provide the gap.

53. The method of claim 40 further comprising:
forming a grounding mesh on the ground plate, said grounding mesh having a plurality of holes sized to capture secondary electrons.

54. The method of claim 40 further comprising:
coupling the base plate with an electron beam column with an orientation to pass an electron beam from the electron beam column through the gap and perpendicular to the one-dimensional array.

55. The method of claim 54 wherein the electron beam has an oblong beam shape, and wherein coupling the base plate further comprises:
orienting a long dimension of the oblong beam shape parallel to a length of the one-dimensional array.

56. The method of claim 40 further comprising:
coupling the base plate with a scan mechanism to scan a beam line from the gap over a surface.

57. The method of claim 56 wherein coupling the base plate to a scan mechanism comprises:
coupling the base plate with a scanner to sweep the beam line over a scan field on the surface in a perpendicular motion relative to a length of the beam line; and
coupling the base plate with a stage incrementer to incrementally advance to a new scan field on the surface in a parallel motion relative to the length of the beam line.

58. The method of claim 40 further comprising:
coupling the base plate with a detector positioned relative to the base plate to receive electrons emitted from a surface due to a beam line incident on the surface after passing through the gap.

59. The method of claim 58 wherein coupling the base plate comprises:
supplying a plurality of filters corresponding to the plurality of conductor pads, each of the plurality of filters to pass electrons emitted from the surface due to a particular segment of the beam line based on a unique frequency signature corresponding to one of the plurality of conductor pads.

60. The method of claim 58 further comprising:
coupling a time division multiplexing (TDM) circuit with the plurality of conductor pads, said TDM circuit to define a time slot for each of the plurality of conductor pads, wherein one of the plurality of conductor pads is to pass a particular segment of the electron beam line for each time slot.

61. The method of claim 40 wherein coupling the ground plate to form the beam blankers comprises one of:
forming electron beam blankers; and
forming ion beam blankers.

62. A method comprising:
receiving a beam at a one-dimensional blanker array, said one-dimensional blanker array comprising a base plate, a plurality of conductor pads arranged in a one-dimensional array on the base plate, and a ground plate coupled to the base plate over the plurality of conductor pads with a gap to form a beam blanker with each of the plurality of conductor pads;
forming a beam line through the gap in the one-dimensional blanker array; and
selectively applying voltage to the plurality of conductor pads to deflect corresponding segments of the beam line.

63. The method of claim 62 wherein selectively applying the voltage comprises:
applying a frequency signature to a given conductor pad, the frequency signature being unique among the plurality of conductor pads.

64. The method of claim 62 wherein selectively applying the voltage comprises:
selecting a voltage level to apply to a given conductor pad from a range of available voltages; and
applying the selected voltage level to the given conductor pad.

65. The method of claim 62 further comprising:
electrically isolating the plurality of conductor pads one from another.

66. The method of claim 62 further comprising:
leaking off charge build-up from the plurality of conductor pads.

67. The method of claim 62 further comprising:
grounding at least a region of the ground plate that is aligned with the plurality of conductor pads.

68. The method of claim 62 wherein the plurality of conductor pads comprises a first array of conductor pads, and wherein the one-dimensional blanker array further comprises a second array of conductor pads on the base plate, said second array being aligned with the first array in series relative to a beam direction, and said ground plate being coupled to the base plate over both the first array and the second array.

69. The method of claim 68 further comprising:
selectively applying voltage to the second array.

70. The method of claim 69 wherein:
selectively applying voltage to the first array comprises selectively applying one of a positive voltage and a negative voltage; and
selectively applying voltage to the second array comprises selectively applying an opposite one of the positive voltage and the negative voltage.

71. The method of claim 70 further comprising:
calibrating the positive voltage and the negative voltage to attenuate beam segments corresponding to each of the plurality of conductor pads of the first array to a predetermined current.

72. The method of claim 70 further comprising:
selectively applying a blanker voltage to at least one of the first array and the second array.

73. The method of claim 68 wherein the one-dimensional blanker array further comprises a third array of conductor pads on the base plate, said third array being aligned with the first array and the second array in series relative to the beam direction, said ground plate being coupled to the base plate over the first array, the second array, and the third array, the method further comprising:
selectively applying a blanker voltage to the third array.

74. The method of claim 62 wherein selectively applying voltage to the plurality of conductor pads comprises:
at least partially deflecting the beam to a respective conductor pad.

75. The method of claim 62 wherein the plurality of conductor pads are arranged in the one-dimensional array in at least two rows staggered by a fraction of a blanker pitch such that a projection of a given conductor pad in a beam direction partially overlaps a projection of at least one neighboring conductor pad, and wherein selectively applying voltage to the plurality of conductor pads comprises:
adjusting a length of a line segment in the beam line corresponding to a first conductor pad using voltages applied to the first conductor pad and at least one neighbor conductor pad.

76. The method of claim 62 wherein each of the plurality of conductor pads is arranged in the one-dimensional array at an angle to a beam direction such that a projection of a given conductor pad in the beam direction partially overlaps a projection of at least one neighboring conductor pad, and wherein selectively applying voltage to the plurality of conductor pads comprises:
adjusting a length of a line segment in the beam line corresponding to a first conductor pad using voltages applied to the first conductor pad and at least one neighbor conductor pad.

77. The method of claim 62 further comprising:
capturing secondary electrons from the plurality of conductor pads at the ground plate.

78. The method of claim 62 wherein the plurality of conductor pads comprises a first array of conductor pads, and wherein the one-dimensional blanker array further comprises a second array of conductor pads on the ground plate, said second array being aligned with the first array across the gap.

79. The method of claim 68 further comprising:
grounding each of the second array of conductor pads.

80. The method of claim 68 further comprising:
selectively applying a voltage to the second array of conductor pads.

81. The method of claim 62 further comprising:
shaping the beam into an oblong beam shape before receiving the beam at the one-dimensional blanker array, the oblong beam shape having a longer dimension parallel to a length of the beam line.

82. The method of claim 62 further comprising:
scanning the beam line over a surface.

83. The method of claim 82 wherein scanning the beam line comprises:
sweeping the beam line over a scan field on the surface in a perpendicular motion relative to a length of the beam line; and
incrementally advancing to a new scan field on the surface in a parallel motion relative to the length of the beam line.

84. The method of claim 82 wherein scanning the beam line comprises:
positioning the beam line to a particular vector location on the surface; and
sweeping the beam line over a scan field at the particular vector location in a perpendicular motion relative to a length of the beam line.

85. The method of claim 82 wherein selectively applying voltage comprises:
blanking segments of the beam line as the beam line is scanned over the surface to define features of an image being projected to the surface.

86. The method of claim 85 further comprising:
receiving data defining the features of the image.

87. The method of claim 86 wherein the data comprises voltage levels and durations for each level for each of the plurality of conductor pads based on a position within the image and a scan speed.

88. The method of claim 62 further comprising:
detecting electrons emitted from a surface due to the beam line incident on the surface.

89. The method of claim 88 wherein detecting the electrons comprises:
filtering the electrons based on unique frequency signatures corresponding to each of the plurality of conductor pads.

90. The method of claim 88 wherein detecting the electrons comprises:
time division multiplexing (TDM) segments of the beam line to time slots corresponding to each of the plurality of conductor pads, wherein one of the plurality of conductor pads is to pass a segment of the beam line for each time slot.

91. The method of claim 62 wherein receiving the beam comprises one of:
receiving an electron beam; and
receiving an ion beam.

92. The method of claim 88 further comprising:
generating data defining the surface based on the detected electrons.

93. A method comprising:
receiving a beam at a one-dimensional blanker array, said one-dimensional blanker array comprising a base plate, a first array of conductor pads arranged in a one-dimensional array on the base plate, a second array of conductor pads arranged on the base plate aligned with the first array in series relative to a beam direction, and a ground plate coupled to the base plate over both the first array and the second array with a gap to form a beam blanker with each aligned pair of conductor pads;
forming a beam line through the gap in the one-dimensional blanker array;
detecting electrons emitted from a surface due to the beam line incident on the surface; and
calibrating voltages applied to individual conductor pads of the first and second arrays based on intensities of the electrons corresponding to each aligned pair of conductor pads.

94. The method of claim 93 wherein calibrating voltages comprises:
selectively applying one of a positive voltage and a negative voltage to the first array to at least partially deflect corresponding line segments of the beam line; and
selectively applying an opposite one of the positive voltage and the negative voltage to the second array.

95. The method of claim 93 wherein calibrating voltages comprises:
attenuating the intensities to a predetermined intensity.

96. The method of claim 93 wherein detecting the electrons comprises:
filtering the electrons based on unique frequency signatures corresponding to each of the plurality of conductor pads.

97. The method of claim 93 wherein detecting the electrons comprises:
time division multiplexing (TDM) segments of the beam line to time slots corresponding to each of the aligned pairs of conductor pads, wherein one of the aligned pairs of conductor pads is to pass a segment of the beam line for each time slot.

98. The method of claim 93 wherein receiving the beam comprises one of:
receiving an electron beam; and
receiving an ion beam.

* * * * *

UNITED STATES PATENT AND TRADEMARK OFFICE
CERTIFICATE OF CORRECTION

PATENT NO. : 6,803,582 B2  
DATED : October 12, 2004  
INVENTOR(S) : C. Neil Berglund It is certified that error appears in the above-identified patent and that said Letters Patent is hereby corrected as shown below:

Title page,
Item [57], ABSTRACT,
Line 1, "A beam array includes…" should read -- A beam blanker array includes… --.

Column 6,
Line 32, "…or a-vacuum." should read -- …or a vacuum. --;
Line 65, "…exit-the…" should read -- …exit-the… --;

Column 8,
Line 29, "…of-how…" should read -- …of how… --;

Column 11,
Line 12, "…controller,1350…" should read -- …controller 1350… --;

Column 15,
Line 30, "…incident-on…" should read -- incident on… ;

Column 16,
Line 35, "…110 device(s)…" should read -- …I/O device(s)… --; and

Column 23,
Lines 10 and 12, "…claim 68…" should read -- claim 78… --.

Signed and Sealed this

Seventh Day of February, 2006

JON W. DUDAS  
*Director of the United States Patent and Trademark Office*